(12) United States Patent
Abdo et al.

(10) Patent No.: US 12,148,974 B2
(45) Date of Patent: Nov. 19, 2024

(54) FABRICATION OF SUPERCONDUCTING DEVICES THAT CONTROL DIRECT CURRENTS AND MICROWAVE SIGNALS

(71) Applicant: International Business Machines Corporation, Armonk, NY (US)

(72) Inventors: Baleegh Abdo, Fishkill, NY (US); Markus Brink, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 336 days.

(21) Appl. No.: 17/658,283

(22) Filed: Apr. 7, 2022

(65) Prior Publication Data

US 2022/0232710 A1 Jul. 21, 2022

Related U.S. Application Data

(62) Division of application No. 16/160,347, filed on Oct. 15, 2018, now Pat. No. 11,317,519.

(51) Int. Cl.
*H01P 5/12* (2006.01)
*H01P 1/20* (2006.01)
(Continued)

(52) U.S. Cl.
CPC ............. *H01P 5/12* (2013.01); *H01P 1/2007* (2013.01); *H01P 11/001* (2013.01); *H03H 3/00* (2013.01);
(Continued)

(58) Field of Classification Search
CPC .......... H01P 5/12; H01P 1/365; H01P 1/2039; H01P 11/001
(Continued)

(56) References Cited

U.S. PATENT DOCUMENTS 5,244,869 A   9/1993  Billing
6,657,324 B1  12/2003 Marumoto
(Continued)

FOREIGN PATENT DOCUMENTS

CN   1960053 A   5/2007
DE   4135862 A1  3/1992
(Continued)

OTHER PUBLICATIONS

Decision to Grant a Patent received for Japanese Patent Application Serial No. 2021-517638 dated May 30, 2023, 18 pages(Including English Translation).
(Continued)

*Primary Examiner* — Rakesh B Patel
(74) *Attorney, Agent, or Firm* — Amin, Turocy & Watson, LLP

(57) ABSTRACT

Fabrication of superconducting devices that combine or separate direct currents and microwave signals is provided. A method can comprise forming a direct current circuit that supports a direct current, a microwave circuit that supports a microwave signal, and a common circuit that supports the direct current and the microwave signal. The method can also comprise operatively coupling a first end of the direct current circuit and a first end of the microwave circuit to a first end of the common circuit. The direct current circuit can comprise a bandstop circuit and the microwave circuit can comprise a capacitor. Alternatively, the direct current circuit can comprise a bandstop circuit and the microwave circuit can comprise a bandpass circuit. Alternatively, the microwave circuit can comprise a capacitor and the direct current circuit can comprise one or more quarter-wavelength transmission lines.

19 Claims, 24 Drawing Sheets

(51) Int. Cl.
*H01P 1/365* (2006.01)
*H01P 11/00* (2006.01)
*H03H 3/00* (2006.01)
*H03H 7/01* (2006.01)
*H05K 3/06* (2006.01)
*H05K 3/46* (2006.01)
*H01P 1/203* (2006.01)
*H03H 7/46* (2006.01)

(52) U.S. Cl.
CPC ............ *H03H 7/0161* (2013.01); *H05K 3/06* (2013.01); *H05K 3/4644* (2013.01); *H01P 1/2039* (2013.01); *H01P 1/365* (2013.01); *H03H 7/0123* (2013.01); *H03H 2007/013* (2013.01); *H03H 7/46* (2013.01)

(58) Field of Classification Search
USPC ............... 333/132, 134, 136, 202–205, 99 S
See application file for complete search history.

(56) References Cited

U.S. PATENT DOCUMENTS

| | | | |
|---|---|---|---|
| 7,417,516 | B2 | 8/2008 | Singh |
| 8,350,642 | B2 | 1/2013 | Jensen |
| 8,644,896 | B1 | 2/2014 | Bock et al. |
| 9,548,742 | B1 | 1/2017 | Abdo |
| 9,735,776 | B1 | 8/2017 | Abdo et al. |
| 9,793,913 | B2 | 10/2017 | Bulzacchelli et al. |
| 9,793,933 | B1 | 10/2017 | Gupta et al. |
| 9,870,536 | B1 | 1/2018 | Abdo |
| 9,941,908 | B2 | 4/2018 | Bauder |
| 10,522,889 | B2 * | 12/2019 | Rowland .................. H03H 7/01 |
| 2010/0264948 | A1 | 10/2010 | Strid et al. |
| 2014/0340156 | A1 | 11/2014 | Kuroda |
| 2015/0238257 | A1 | 8/2015 | Hancock et al. |
| 2017/0179999 | A1 | 6/2017 | Vassiliou et al. |
| 2018/0013426 | A1 | 1/2018 | Deurloo et al. |
| 2018/0091244 | A1 | 3/2018 | Abdo et al. |
| 2019/0044668 | A1 | 2/2019 | Elsherbini et al. |

FOREIGN PATENT DOCUMENTS

| | | |
|---|---|---|
| EP | 1 121 725 A1 | 8/2001 |
| JP | S 55-049008 A | 4/1980 |
| JP | 03145810 A | 6/1991 |
| JP | 2000-311573 A | 11/2000 |
| JP | 2007096928 A | 4/2007 |
| JP | 2010-507929 A | 3/2010 |
| JP | 2010-141787 A | 6/2010 |
| JP | 2017192094 A | 10/2017 |
| JP | 2018-088638 A | 6/2018 |
| WO | 94/028592 A1 | 12/1994 |
| WO | 9428592 A1 | 12/1994 |
| WO | 0024079 A1 | 4/2000 |
| WO | 2008/036469 A1 | 3/2008 |
| WO | 2008/143071 A1 | 8/2010 |

OTHER PUBLICATIONS

Communication Pursuant to Article 94(3) EPC received for E.P Patent Application Serial No. 19786321.0 dated Sep. 30, 2022, 26 pages.
Non-Final Office Action received for U.S. Appl. No. 16/006,255 dated Dec. 20, 2019, 21 pages.
Denis, et al., "Fabrication of Superconducting Vacuum-Gap Crossovers for High Performance Microwave Applications," IEEE Transactions On Applied Superconductivity, vol. 27, No. 4, Jun. 2017, 4 pages.
Vissers et al., "Low-noise kinetic inductance traveling-wave amplifier using three-wave mixing," Applied Physics etters, 2016, vol. 108, No. 1, 012601, 5 pages.
Rotzinger et al., "Aluminium-oxide wires for superconducting high kinetic inductance circuits," arXiv:1408.4347v3cond-mat.supr-con], Jun. 15, 2016, 16 pages.
Erickson et al., "Frequency Comb Generation in Superconducting Resonators," Physical Review Letters, 2014, vol. 113, No. 18, 187002, 5 pages.
Niepce et al., "High Kinetic Inductance NbN Nanowire Superinductors," arXiv: 1802.01723v1 [cond-mat.mes-hall], Feb. 5, 2018, 12 pages.
Maleeva et al., "Circuit Quantum Electrodynamics of Granular Aluminum Resonators," arXiv:1802.01859v2 [condmat.supr-con], Feb. 7, 2018, 17 pages.
International Search Report and Written Opinion received for PCT Application Serial No. PCT/EP2019/077247 dated Dec. 19, 2019, 20 pages.
Jun etal., "Compact Square DC-Block Bandpass Filter With Slots", Progress in Electromagnetics Research Letters, vol. 38, Jan. 1, 2013 , pp. 17-23.
List of IBM Patents or Applications Treated as Related.
Office Action received for Chinese Patent Application No. 201980067853.8 dated Aug. 17, 2021, 13 pages.
Non-Final Office Action received for U.S. Appl. No. 16/160,347 dated Oct. 6, 2021, 32 pages.
Office Action received for Chinese Patent Application No. 201980067853.8 dated Feb. 28, 2022, 10 pages.
Reply to Communication Pursuant to Article 94(3) EPC received for E.P Patent Application Serial No. 19786321.0 filed Jan. 6, 2023, 2 pages.

\* cited by examiner

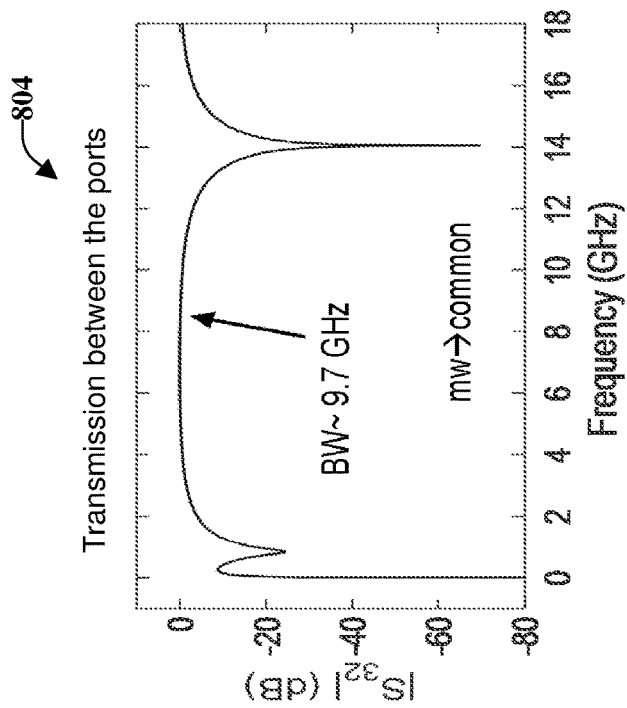
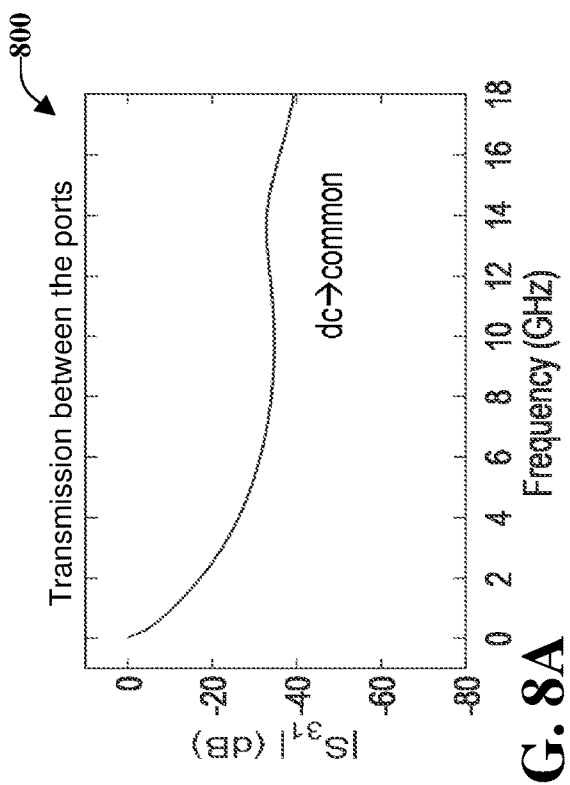
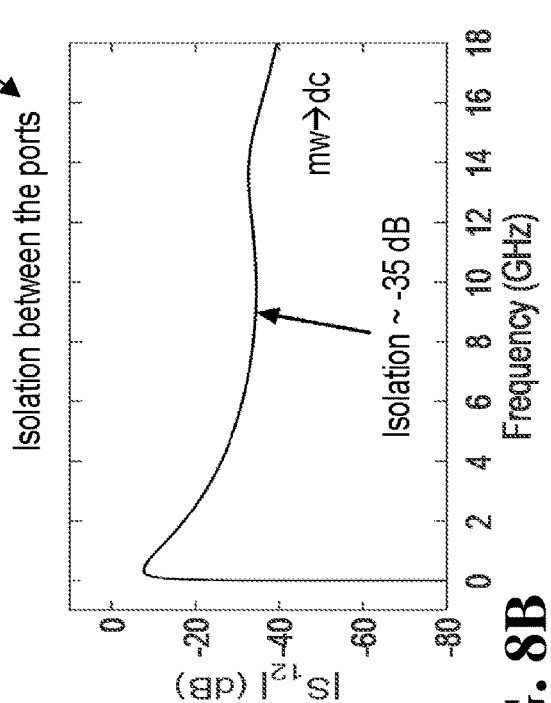
FIG. 8A
FIG. 8B
FIG. 8C

FABRICATION OF SUPERCONDUCTING DEVICES THAT CONTROL DIRECT CURRENTS AND MICROWAVE SIGNALS

BACKGROUND

A superconducting device is a device that can provide zero electrical resistance below a defined temperature. A superconducting device can be employed, for example, as a qubit for a quantum computer. In another example, a superconducting device can be a combiner and/or separator of direct currents and microwave signals.

For example, a method and/or device for combining and/or separating direct currents and/or microwave signals is through the use of bias-tees (e.g., not superconducting). A bias tee is a three-port circuit used to set a direct current bias point of a microwave device. However, bias-tees require the use of a large capacitance (e.g., around 0.01 micro Farad ($\mu F$)) and a large inductance (e.g., around 1 millihenry (mH)), which are difficult to realize on a chip. A problem associated with large inductances is that they can be technologically difficult to realize, occupy a large amount of space, and/or introduce loss for signals. Thus, attempts have been made to reduce an inductance of a superconducting device.

In another example, in one attempt at reduction of inductance, "vacuum-gap crossovers were realized by using a sacrificial polymer layer followed by niobium sputter deposition optimized for coating coverage over an underlying niobium signal layer." See Denis et al., "Fabrication of Superconducting Vacuum-Gap Crossovers for High Performance Microwave Applications," IEEE Transactions on Applied Superconductivity, Vol. 27, No. 4, June 2017, Abstract. "Both coplanar waveguide and microstrip crossover topologies have been explored in detail." See id. "The resulting fabrication process is compatible with a bulk micromachining process for realizing waveguide coupled detectors, which includes sacrificial wax bonding, and wafer backside deep reactive ion etching for creation of leg isolated silicon membrane structures." See id. at Abstract. However, superconducting devices and fabrication of the same can be improved.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein are devices, systems, methods, computer-implemented methods, methods, apparatuses, and/or computer program products that facilitate fabrication of superconducting devices that control direct currents and microwave signals for quantum applications.

According to an embodiment, a method can comprise forming a direct current circuit that supports a direct current, a microwave circuit that supports a microwave signal, and a common circuit that supports the direct current and the microwave signal. The direct current circuit can comprise a bandstop circuit. The microwave circuit can comprise a capacitor. The method can also comprise operatively coupling a first end of the direct current circuit and a first end of the microwave circuit to a first end of the common circuit. An advantage of such a method is superconducting devices that allow combining and/or separating direct currents and microwave signals can be realized as an on-chip superconducting circuit.

In accordance with another embodiment, a method can comprise forming a direct current circuit that supports a direct current, a microwave circuit that supports a microwave signal, and a common circuit that supports the direct current and the microwave signal. The direct current circuit can comprise a bandstop circuit and the microwave circuit can comprise a bandpass circuit. The method can also comprise operatively coupling a first end of the direct current circuit and a first end of the microwave circuit to a first end of the common circuit. An advantage of such a method is that the direct current and microwave signal combiner and/or separator can be realized using a superconducting circuit.

According to another embodiment, a method can comprise forming a direct current circuit that supports a direct current, a microwave circuit that supports a microwave signal, and a common circuit that supports the direct current and the microwave signal. The direct current circuit can comprise a first quarter-wavelength transmission line shunted by a first capacitor. The method can also comprise operatively coupling the common circuit to a first portion of the direct current circuit and a first portion of the microwave circuit. An advantage of such a method is that the direct current and microwave signal combiner and/or separator can be fabricated without of the use of large inductances, which can be difficult to realize.

In accordance with another embodiment, a method can comprise forming a direct current circuit that supports a direct current, a microwave circuit that supports a microwave signal, and a common circuit that supports the direct current and the microwave signal. Forming the direct current circuit can comprise shunting a first quarter-wavelength transmission line with a first capacitor. Further, forming the microwave circuit can comprise inserting a second capacitor in the microwave circuit. The method can also comprise operatively coupling the common circuit to a first end of the direct current circuit and a first end of the microwave circuit. An advantage of such a method is that the direct current and microwave signal combiner and/or separator can be realized as an on-chip superconducting circuit.

According to a further embodiment, a method can comprise forming a direct current circuit that supports a direct current, a microwave circuit that supports a microwave signal, and a common circuit that supports the direct current and the microwave signal. Forming the direct current circuit can comprise shunting a first quarter-wavelength transmission line with a first capacitor to ground and a second quarter-wavelength transmission line with a second capacitor to ground. In addition, forming the microwave circuit can comprise inserting a third capacitor in the microwave circuit. The method can also comprise operatively coupling a first end of the direct current circuit and a first end of the microwave circuit to a first end of the common circuit. An advantage of such a method is superconducting devices that allow combining and/or separating direct currents and microwave signals can be fabricated without of the use of large inductances, which can be difficult to realize.

DESCRIPTION OF THE DRAWINGS

FIGS. 8A-8C illustrate example, non-limiting, graphs of simulation results of the implementation example of the system of FIG. 7 in accordance with one or more embodiments described herein.

DETAILED DESCRIPTION

Figure 1:
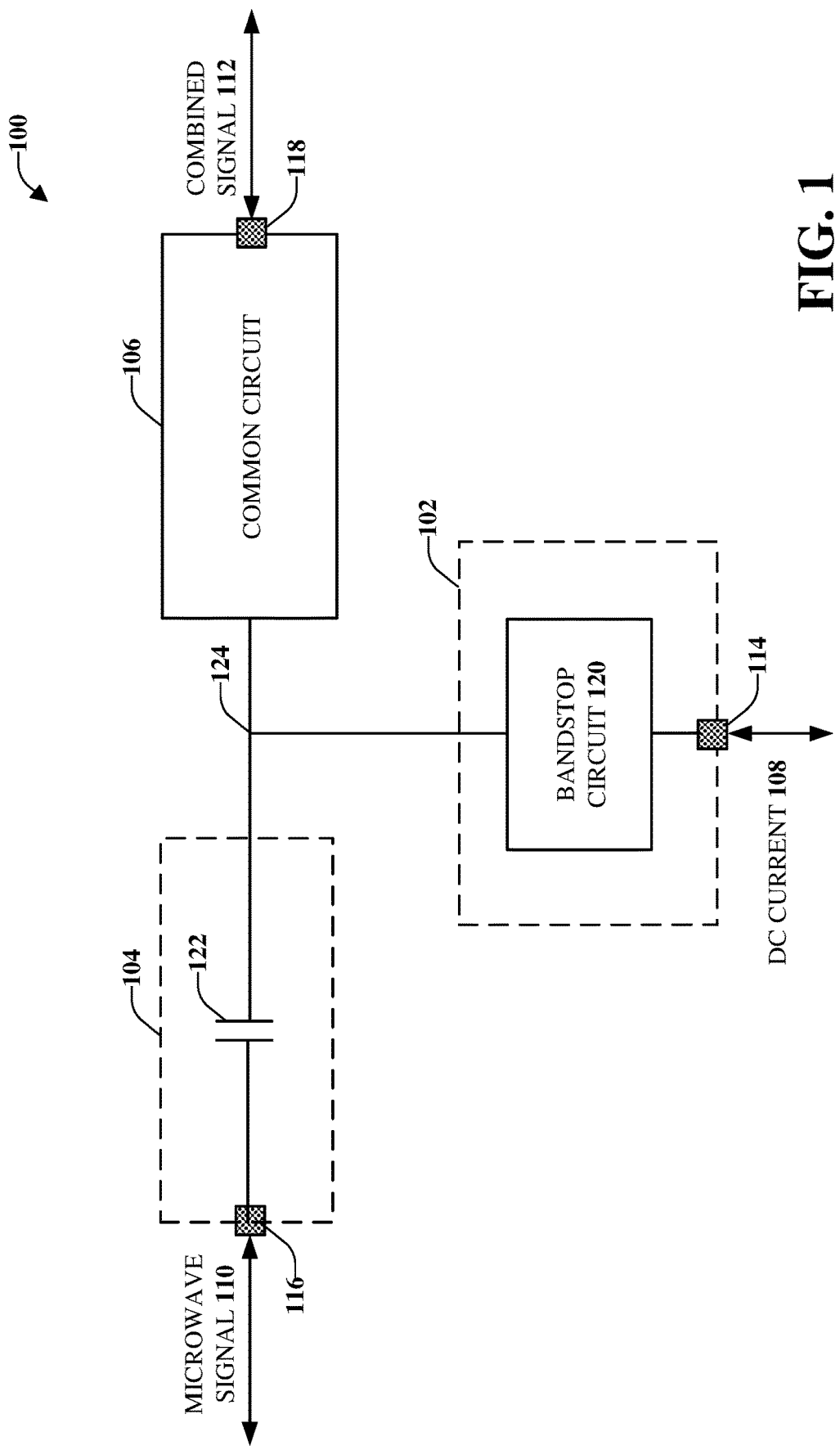
FIG. 1 illustrates a block diagram of an example, non-limiting, system that provides an improved superconducting device that can be fabricated in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

A superconducting device can be a device that provides zero electrical resistance below a defined temperature. In an example, a superconducting device can be employed as a qubit for a quantum computer. In another example, a superconducting device can be a combiner and/or separator of direct currents (DC currents) and microwave signals.

An issue the disclosed aspects addresses is that, generally, a microwave device that combines and/or separates DC currents and microwave signals employs very large inductances that can be technologically difficult to realize, occupy a large amount of space, and/or can be lossy. To realize such a microwave device using superconducting components, it is desirable to significantly reduce the inductance of the superconducting device and/or to improve one or more of its characteristics.

To address the above and/or other issues, one or more embodiments described herein include systems, methods, and computer program products that facilitate fabrication of cryogenic combiners of DC currents and microwave signals. For example, fabrication of an improved superconducting combiner of DC currents and microwave signals can be provided. Additionally, or alternatively, fabrication of an improved superconducting separator of DC currents and microwave signals can be provided. In an embodiment, the superconducting devices disclosed herein can be fabricated on-chip. In another embodiment, the superconducting devices can comprise multiple ports for combining and/or separating multiple signals.

For example, a superconducting device can comprise a first port that supports a DC current (e.g., a DC port), a second port that supports a microwave signal (e.g., a microwave port), and a third port that supports both the microwave signal and the DC current (e.g., a common port). In an aspect, the superconducting device can comprise a first circuit arm (e.g., a DC circuit arm) that supports DC currents signals and a second circuit arm (e.g., a microwave circuit arm) that supports microwave signals. The first circuit arm and the second circuit arm can be joined at a common node and a third arm that can support both the DC currents and the microwave signals.

In an embodiment where a microwave signal is input to a microwave port, a DC current can be input to a DC port, and a combined signal exits through a common port, the superconducting device can be implemented as a combiner. In another embodiment where a microwave signal and a DC current are input to a common port, the microwave signal exits through a microwave port, and the DC current exits through a DC port, the superconducting device can be implemented as a splitter.

In some embodiments, the second circuit arm (e.g., the microwave circuit arm) can comprise a capacitor, and the first circuit arm (e.g., the DC circuit arm) can comprise a bandstop filter that can support DC currents and can block microwave signals within a bandwidth of the superconducting device. In another embodiment, the second circuit arm (e.g., the microwave circuit arm) can comprise a bandpass filter that can allow transmission of microwave signals within a bandwidth of the superconducting device, and the first circuit arm (e.g., the DC circuit arm) can comprise a bandstop filter that can support DC currents and can block microwave signals within the bandwidth of the superconducting device. In yet another embodiment, the second circuit arm (e.g., the microwave circuit arm) can comprise a capacitor and the first circuit arm (e.g., the DC circuit arm) can comprise a quarter-wavelength transmission line that can be shunted by a capacitor coupled to electrical ground, where the length of the transmission line can refer to a quarter of a wavelength associated with a center frequency of the superconducting device. In yet another embodiment, the second circuit arm (e.g., the microwave circuit arm) can comprise a capacitor and the first circuit arm (e.g., the DC circuit arm) can comprise a quarter-wavelength transmission line that can be shunted by a capacitor to electrical ground and another quarter-wavelength transmission line that can be shunted by another capacitor to electrical ground, where quarter wavelengths corresponding to lengths of the transmission lines for the first circuit arm can be different (e.g., associated with two different center frequencies of the superconducting device). As such, inductances of a superconducting device that combines and/or separates DC currents and microwave signals can be reduced. Furthermore, bandwidth of microwave signals transmitted by the superconducting device can be improved as well as isolation between microwave and DC ports. The superconducting device can also be a superconducting DC current and microwave combiner and/or separator device designed for narrowband communication or wideband communication. Moreover, isolation between the DC and the microwave ports of the superconducting device can also be increased. Therefore, an improved superconducting device can be provided.

According to some implementations, the various aspects discussed herein (e.g., the combiner and/or separator superconducting device) can be utilized for a quantum-limited amplifier, such as a Josephson Parametric Converter (JPC). For example, the superconducting device can be employed to combine a pump tone that drives a superconducting quantum element (e.g., the JPC) and the DC current that flux-biases the superconducting quantum element (e.g., the JPC). Furthermore, the superconducting device can inject the combined signals into an on-chip, pump line of the superconducting quantum element (e.g., the JPC) that can support the DC current and/or the microwave signal.

In another example, the various aspects discussed herein (e.g., the combiner and/or separator device) can be utilized for a quantum-limited amplifier, such as a Kinetic Inductance Traveling wave (KIT) amplifier. For example, the superconducting device can be employed to combine the DC current that biases the superconducting quantum element (e.g., the KIT amplifier) and the microwave signal to be amplified. Furthermore, the superconducting device can feed the DC current and the microwave signal to an input of the superconducting quantum element (e.g., the KIT amplifier) via the combined signal. Moreover, in an embodiment, the superconducting device can be employed to separate the microwave signal (e.g., an amplified quantum microwave signal) and the DC current that biases the superconducting quantum element (e.g., the KIT amplifier) at an output of the superconducting quantum element (e.g., the KIT amplifier).

In another embodiment, the superconducting quantum element can be a qubit. For example, the superconducting quantum element can be a tunable superconducting qubit. In an aspect, the superconducting device can drive and/or flux-bias the superconducting quantum element (e.g., the qubit) via the combined signal. However, it is to be appreciated that the superconducting quantum element can be a different type of quantum element and/or the superconducting device can be employed for a different type of implementation associated with quantum computing.

FIG. 1 illustrates a block diagram of an example, non-limiting, system 100 that provides an improved superconducting device that can be fabricated in accordance with one or more embodiments described herein. As disclosed herein, the term "superconducting device" can refer to a superconducting device that combines and/or that separates DC currents and microwave signals that fall within its bandwidth. The system 100 can be, for example, a superconducting device (e.g., a superconducting circuit). In an embodiment, the system 100 can be associated with a superconducting combiner. For example, the system 100 can be associated with a superconducting DC current and microwave signal combiner. In another embodiment, the system 100 can be associated with a superconducting separator. For example, the system 100 can be associated with a superconducting DC current and microwave signal separator. In certain embodiments, the system 100 can be realized on chip.

In the embodiment of FIG. 1, the system 100 can comprise a DC circuit 102, a microwave circuit 104, and a common circuit 106. The DC circuit 102 can provide transmission of a DC current 108. The microwave circuit 104 can provide transmission of a microwave signal 110. The common circuit 106 can provide transmission of a combined signal 112. The combined signal 112 can be, for example, a combination of the DC current 108 and the microwave signal 110. The DC current 108 can be one or more DC currents, the microwave signal 110 can be one or more microwave signals, and the combined signal 112 can be one or more combined signals.

The DC current 108 can be an electrical signal associated with flow of electrical current. The DC current 108 can comprise a constant voltage and/or a constant current. The microwave signal 110 can be a radio frequency signal associated with an oscillatory change in voltage and/or current. In an aspect, the microwave circuit 104 and the DC circuit 102 can be joined by the common circuit 106. For example, the DC circuit 102 can be a first circuit arm that supports the DC current 108 and the microwave circuit 104 can be a second circuit arm that supports the microwave signal 110. Furthermore, the common circuit 106 can be a third circuit arm that joins the DC circuit 102 (e.g., the first circuit arm) and the microwave circuit 104 (e.g., the second circuit arm). The DC circuit 102 can comprise a DC port 114, the microwave circuit 104 can comprise a microwave port 116, and/or the common circuit 106 can comprise a common port 118. The DC port 114, the microwave port 116, and/or the common port 118 can be, for example, one or more ports for a superconducting device.

In accordance with an aspect, the DC circuit 102, the microwave circuit 104, and the common circuit 106 can be implemented to combine and/or separate the DC current 108 and the microwave signal 110. In an embodiment, the common circuit 106 can combine the DC current 108 received via the DC port 114 and the microwave signal 110 received via the microwave port 116 to generate the combined signal 112 that can be output via the common port 118. As such, in an embodiment, the DC circuit 102, the microwave circuit 104, and the common circuit 106 can be implemented as a combiner circuit. In another embodiment, the common circuit 106 can separate the combined signal 112 that can be received via the common port 118 into the DC current 108 via the DC port 114 and the microwave signal 110 via the microwave port 116. As such, in another embodiment, the DC circuit 102, the microwave circuit 104, and the common circuit 106 can be implemented as a separator circuit.

In the embodiment of FIG. 1, the DC circuit 102 can comprise a bandstop circuit 120. The bandstop circuit 120 can be a bandstop filter that supports DC currents and blocks transmission of one or more microwave signals within a bandwidth of a superconducting device. The bandstop circuit 120 can be, for example, a bandstop filter that filters (e.g., attenuates) a set of frequencies associated with the microwave signal 110. In an aspect, the bandstop circuit 120 can support transmission of the DC current 108. Furthermore, the bandstop circuit 120 can block transmission of a portion of the microwave signal 110 within a bandwidth of a superconducting device that comprises the DC circuit 102, the microwave circuit 104, and/or the common circuit 106.

Furthermore, the microwave circuit 104 can comprise a capacitor 122, which can allow the microwave signal 110 to be transmitted through the microwave circuit 104 via wideband communication. The capacitor 122 can be electrically coupled to the microwave port 116. Furthermore, the capacitor 122 can be electrically coupled to the common circuit 106 and the DC circuit 102.

Further, as illustrated, to combine the circuits (e.g., the DC circuit 102, the microwave circuit 104, and the common circuit 106), a common node 124 (and arm) can be formed at a first end of the common circuit. A first end of the DC circuit 102 and a first end of the microwave circuit 104 can be operatively coupled to the common node 124. Further to this example, a second end of the DC circuit can be operatively coupled to the DC port 114, a second end of the microwave circuit 104 can be operatively coupled to the microwave port 116, and a second end of the common circuit can be operatively coupled to the common port 118.

In accordance with some aspects, the system 100 can be employed in an implementation where the microwave signal 110 is within a defined bandwidth. In some embodiments, the bandstop circuit 120 can comprise a set of quarter-wavelength transmission lines to facilitate blocking transmission of a portion of the microwave signal 110 within a bandwidth of a superconducting device that comprises the DC circuit 102, the microwave circuit 104, and/or the common circuit 106.

The system 100 (as well as other systems and/or methods discussed herein) can provide various advantages as compared to conventional DC current and microwave signal combiner and/or separator devices. For example, by employing the system 100, the DC current and microwave signal combiner and/or separator can be realized as an on-chip superconducting circuit. The microwave bandwidth of the DC current and microwave signal combiner and/or separator can also be improved. A superconducting device that comprises the DC circuit 102, the microwave circuit 104, and/or the common circuit 106 can also be provided for narrowband communication or wideband communication by employing the system 100. Moreover, isolation between the DC and the microwave ports of a superconducting device that comprises the DC circuit 102, the microwave circuit 104 and the common circuit 106 can also be increased by employing the system 100.

In various embodiments, the system 100 can be associated with technologies such as, but not limited to, superconducting technologies, quantum hardware technologies, quantum amplifier technologies, tunable superconducting qubit technologies, microwave device technologies, quantum information processing technologies, and/or other technologies. The system 100 can employ hardware and/or software to solve problems that are highly technical in nature, that are not abstract and that cannot be performed as a set of mental acts by a human. Further, some of the processes performed can be performed by one or more specialized computers (e.g., one or more specialized circuits, one or more specialized hardware, and so on) for carrying out defined processes and/or tasks related to a superconducting device and fabrication of the same. The system 100 and/or components of the system can be employed to solve new problems that arise through advancements in technologies mentioned above, such as, for example, superconducting technologies, quantum hardware technologies, quantum amplifier technologies, tunable superconducting qubit technologies, microwave device technologies, quantum information processing technologies and the like. One or more embodiments of the system 100 can provide technical improvements to superconducting systems, quantum hardware systems, quantum amplifier systems, tunable superconducting qubit systems, microwave device systems, quantum information processing systems and/or other technical systems. One or more embodiments of the system 100 can also provide technical improvements to a superconducting device by reducing inductances of the superconducting device, improving bandwidth of a signal transmitted by the superconducting device, configuring design of the superconducting device for narrowband communication or wideband communication, and/or increasing isolation of the superconducting device.

Figure 2:
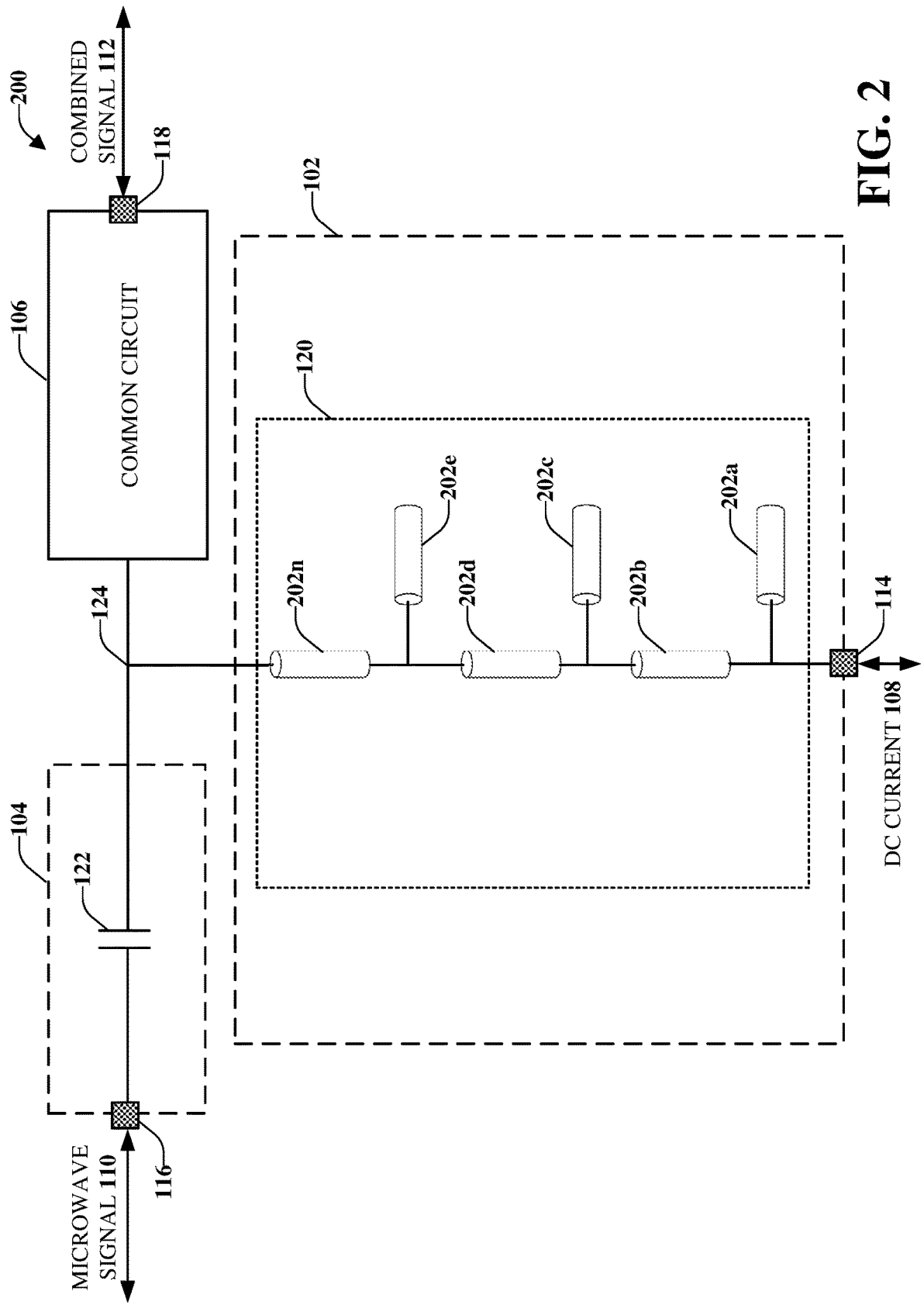
FIG. 2 illustrates a block diagram of an example, non-limiting, system that comprises an embodiment of a circuit for a combiner and/or separator of direct currents and microwave signals in accordance with one or more embodiments described herein.

FIG. 2 illustrates a block diagram of an example, non-limiting, system 200 that comprises an embodiment of a circuit for a combiner and/or separator of DC currents and microwave signals in accordance with one or more embodiments described herein. Repetitive description of like elements employed in other embodiments described herein is omitted for sake of brevity.

The system 200 can be, for example, a superconducting device (e.g., a superconducting circuit). In some embodiments, the system 200 can be associated with a superconducting combiner. In other embodiments, the system 200 can be associated with a superconducting separator. In certain embodiments, the system 200 can be realized on chip. The system 200 comprises the DC circuit 102, the microwave circuit 104, and the common circuit 106. In the embodiment shown in FIG. 2, the DC circuit 102 can comprise the bandstop circuit 120. In an aspect, the DC circuit 102 can comprise the DC port 114, the microwave circuit 104 can comprise the microwave port 116, and/or the common circuit 106 can comprise the common port 118.

The bandstop circuit 120 can comprise a set of transmission lines (e.g., a first transmission line 202a, a second transmission line 202b, a third transmission line 202c, a fourth transmission line 202d, a fifth transmission line 202e, through an nth transmission line 202n, where n is an integer). For example, the set of transmission lines can be a set of quarter-wavelength transmission lines. In one or more embodiments, the bandstop circuit 120 can comprise a different number of transmission lines than the number shown and described. For example, in some embodiments, less than three unit cells associate with the set of quarter-wavelength transmission lines, or more than three unit cells associated with the set of quarter-wavelength transmission lines, can be employed by the bandstop circuit 120. In an embodiment, the first transmission line 202a and the second transmission line 202b can be electrically coupled to the DC port 114. Furthermore, the second transmission line 202b can be electrically coupled to the third transmission line 202c and the fourth transmission line 202d. The fourth transmission line 202d can also be electrically coupled to the fifth transmission line 202e and/or the Nth transmission line 202n. The Nth transmission line 202n can also be electrically coupled to the microwave circuit 104 and the common circuit 106. Furthermore, the first transmission line 202a, the third transmission line 202c, and the fifth transmission line 202e can be open-ended transmission line stubs. In one embodiment, the microwave circuit 104 can comprise the capacitor 122. The capacitor 122 can be electrically coupled to the microwave port 116. Furthermore, the capacitor 122 can be electrically coupled to the common circuit 106 and the DC circuit 102 (e.g., the Nth transmission line 202n of the DC circuit 102). The respective transmission lines of the set of transmission lines can comprise a corresponding length equal to a quarter-wavelength, where wavelength refers to a wavelength associated with a center frequency of a superconducting device that comprises the DC circuit 102, the microwave circuit 104, and/or the common circuit 106. In one example, respective transmission lines of the set of transmission lines can block transmission of a signal at 7 Gigahertz (GHz).

In a non-limiting example, the first transmission line 202a can comprise a first impedance value (e.g., a first impedance value equal to around 265.9 Ohms), the second transmission line 202b can comprise a second impedance value (e.g., a second impedance value equal to about 50 Ohms), the third transmission line 202c can comprise a third impedance value (e.g., a third impedance value equal to approximately 387 Ohms), the fourth transmission line 202d can comprise the second impedance value (e.g., the second impedance value equal to about 50 Ohms), and the fifth transmission line 202e can comprise the first impedance value (e.g., the first impedance value equal to around 265.9 Ohms). Furthermore, the Nth transmission line 202n can comprise the second impedance value (e.g., the second impedance value equal to about 50 Ohms). The capacitor 122 can comprise, for example, a capacitance value equal to around 8 picofarad (pF). However, it is to be appreciated that transmission lines of the set of transmission lines and/or the capacitor 122 can comprise different values, different lengths, and/or a different number of unit cells.

Additionally, the system 200 can provide various advantages as compared to conventional DC current and microwave signal combiner and/or separator devices. For example, by employing the system 200, the DC current and microwave signal combiner and/or separator can be realized as an on-chip superconducting circuit. The microwave bandwidth of the DC current and microwave signal combiner and/or separator can also be improved. A superconducting device that comprises the DC circuit 102, the microwave circuit 104, and/or the common circuit 106 can also be provided for narrowband communication or wideband communication by employing the system 200. Moreover, isolation between the DC and the microwave ports of a superconducting device that comprises the DC circuit 102, the microwave circuit 104, and the common circuit 106 can also be increased by employing the system 200.

Figure 3C:
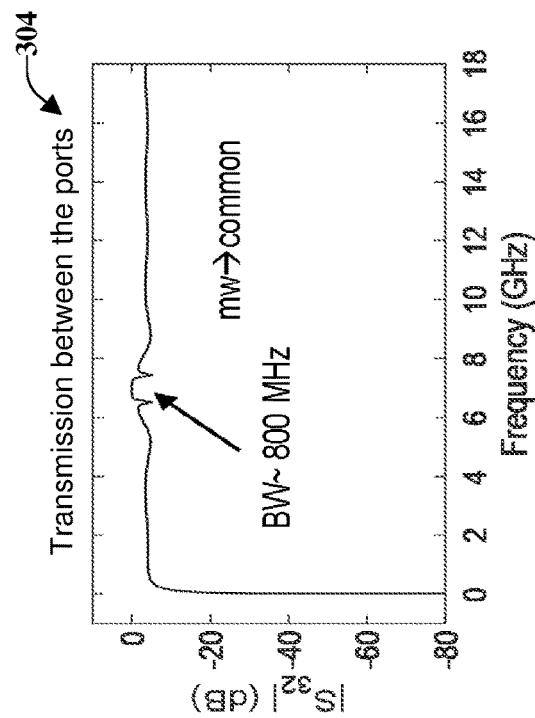
FIGS. 3A-3C illustrate example, non-limiting, graphs of simulation results of the implementation example of the system of FIG. 2 in accordance with one or more embodiments described herein.
Figure 3A:
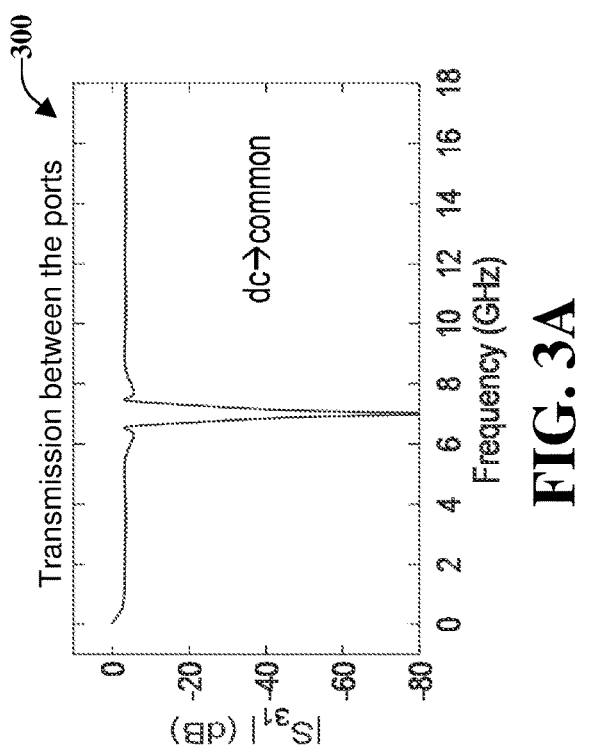
Figure 3B:
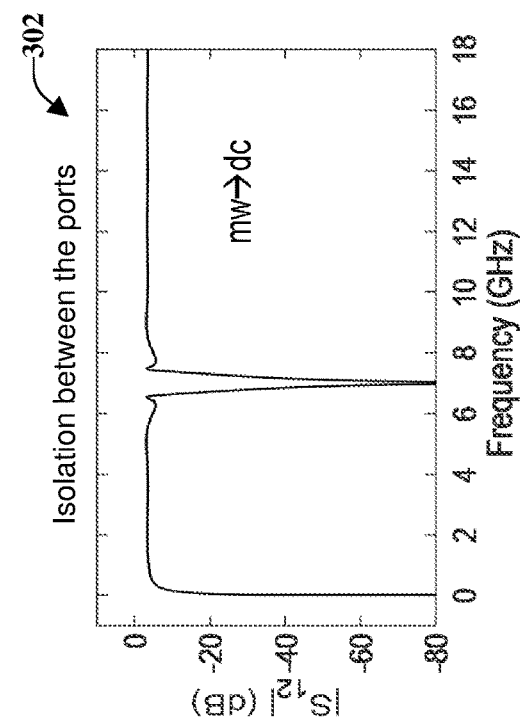

FIGS. 3A-3C illustrate example, non-limiting, graphs of simulation results of the implementation example of the system 200 of FIG. 2 in accordance with one or more embodiments described herein. Repetitive description of like elements employed in other embodiments described herein is omitted for sake of brevity. In the examples of FIGS. 3A-3C, frequency, in GHz is illustrated on the horizontal axis and decibels (dB s) are illustrated on the vertical axis.

FIG. 3A illustrates an example, non-limiting, graph 300 of transmission between the ports (e.g., between the DC port 114 of the DC circuit 102 and the common port 118 of the common circuit 106) according to simulation results. The graph 300 demonstrates that there is a frequency transmission at the DC current. FIG. 3B illustrates an example, non-limiting, graph 302 of isolation between the ports (e.g., between the microwave port 116 of the microwave circuit 104 and the DC port 114 of the DC circuit 102) according to the simulation results. Further, FIG. 3C illustrates an example, non-limiting, graph 304 of the simulation results of transmission between the ports (e.g., between the microwave port 116 of the microwave circuit 104 and the common port 118 of the common circuit 106). FIG. 3C illustrates that a bandwidth of around 800 Megahertz (MHz) around 7 GHz can be passed between the microwave port (e.g., the microwave port 116 of the microwave circuit 104) and the common port (e.g., the common port 118 of the common circuit 106). The graph 304 further illustrates that there is prohibited transmission at zero frequency.

Figure 4:
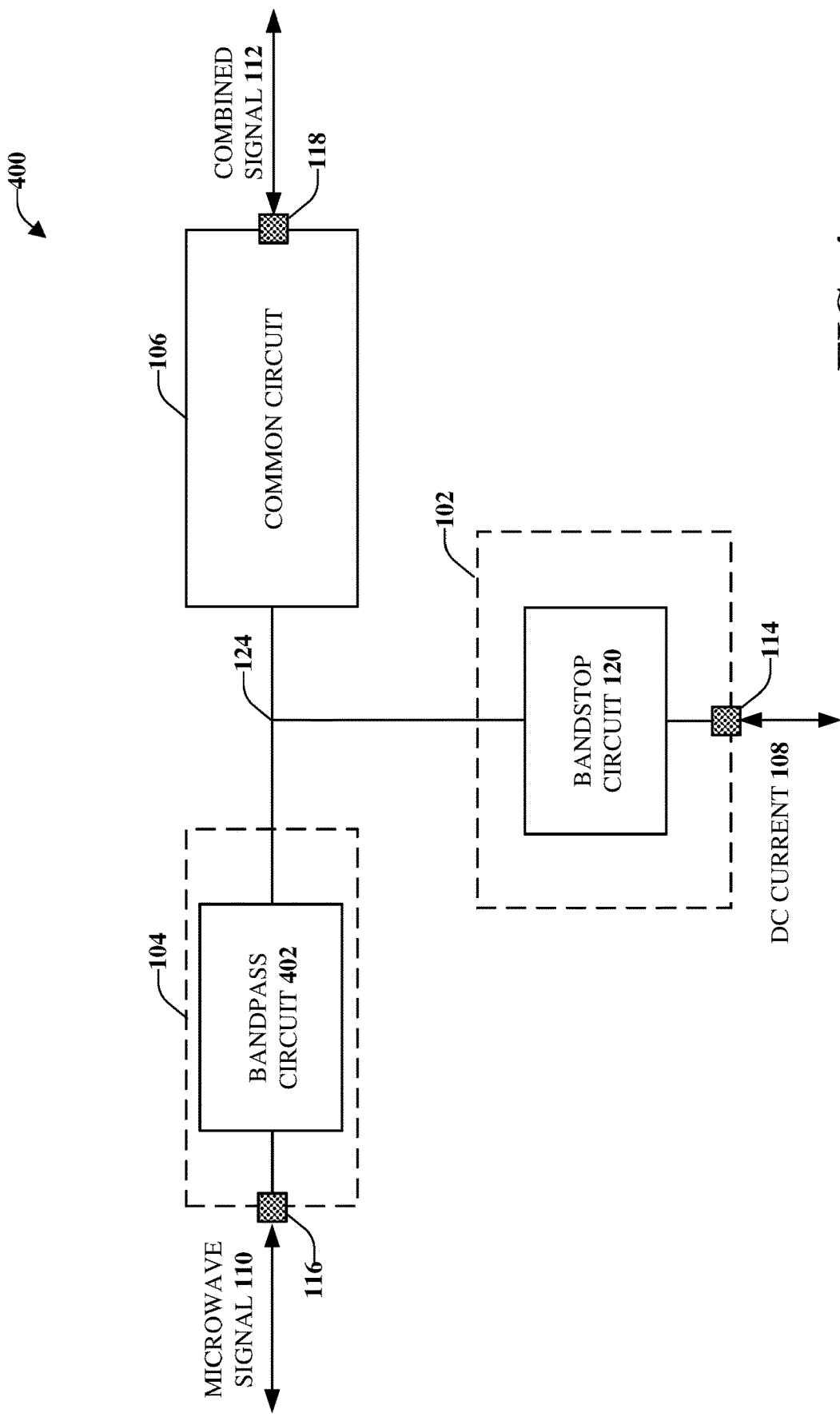
FIG. 4 illustrates a block diagram of an example, non-limiting, system in accordance with one or more embodiments described herein.

FIG. 4 illustrates a block diagram of an example, non-limiting, system 400 in accordance with one or more embodiments described herein. Repetitive description of like elements employed in other embodiments described herein is omitted for sake of brevity.

The system 400 can be, for example, a superconducting device (e.g., a superconducting circuit). In an embodiment, the system 400 can be associated with a superconducting combiner. In another embodiment, the system 400 can be associated with a superconducting separator. In certain embodiments, the system 400 can be realized on chip.

The system 400 comprises the DC circuit 102, the microwave circuit 104, and the common circuit 106. In an aspect, the DC circuit 102 can comprise the DC port 114, the microwave circuit 104 can comprise the microwave port 116, and/or the common circuit 106 can comprise the common port 118. In the embodiment shown in FIG. 4, the DC circuit 102 can comprise the bandstop circuit 120 and the microwave circuit 104 can comprise a bandpass circuit 402.

The bandpass circuit 402 can be, for example, a bandpass filter that filters (e.g., attenuates) a set of frequencies associated with the microwave signal 110. In an aspect, the bandpass circuit 402 can allow transmission of a portion of the microwave signal within a bandwidth of a superconducting device that comprises the DC circuit 102, the microwave circuit 104, and/or the common circuit 106. In an aspect, the system 400 can be employed in an implementation where the microwave signal is within a defined bandwidth.

In some embodiments, the bandpass circuit 402 can comprise a set of lumped circuit elements to facilitate allowing transmission of a portion of the microwave signal within a bandwidth of a superconducting device that comprises the DC circuit 102, the microwave circuit 104, and/or the common circuit 106. For example, the bandpass circuit 402 can comprise a set of inductors and/or a set of capacitors to facilitate allowing transmission of a portion of the microwave signal within a bandwidth of a superconducting device that comprises the DC circuit 102, the microwave circuit 104, and/or the common circuit 106.

Additionally, in accordance with some aspects, the bandstop circuit 120 can be a bandstop filter that filters (e.g., attenuates) a set of frequencies associated with the microwave signal 110. The bandstop circuit 120 can support transmission of the DC current 108. Furthermore, the bandstop circuit 120 can block transmission of a portion of the microwave signal 110 within a bandwidth of a superconducting device that comprises the DC circuit 102, the microwave circuit 104, and/or the common circuit 106. In certain embodiments, the bandstop circuit 120 can comprise a set of quarter-wavelength transmission lines to facilitate blocking transmission of a portion of the microwave signal within a bandwidth of a superconducting device that comprises the DC circuit 102, the microwave circuit 104, and/or the common circuit 106. For example, the bandstop circuit 120 can comprise the set of transmission lines (e.g., the first transmission line 202a, the second transmission line 202b, the third transmission line 202c, the fourth transmission line 202d, the fifth transmission line 202e, through the nth transmission line 202n).

Additionally, the system 400 can provide various advantages as compared to conventional DC current and microwave signal combiner and/or separator devices. For example, by employing the system 400, the DC current and microwave signal combiner and/or separator can be realized as on-chip superconducting circuit. The microwave bandwidth of the DC current and microwave signal combiner and/or separator can also be improved. A superconducting device that comprises the DC circuit 102, the microwave circuit 104, and/or the common circuit 106 can also be provided for narrowband communication or wideband communication by employing the system 400. Moreover, isolation between the DC and the microwave ports of a superconducting device that comprises the DC circuit 102, the microwave circuit 104, and the common circuit 106 can also be increased by employing the system 400.

Figure 5:
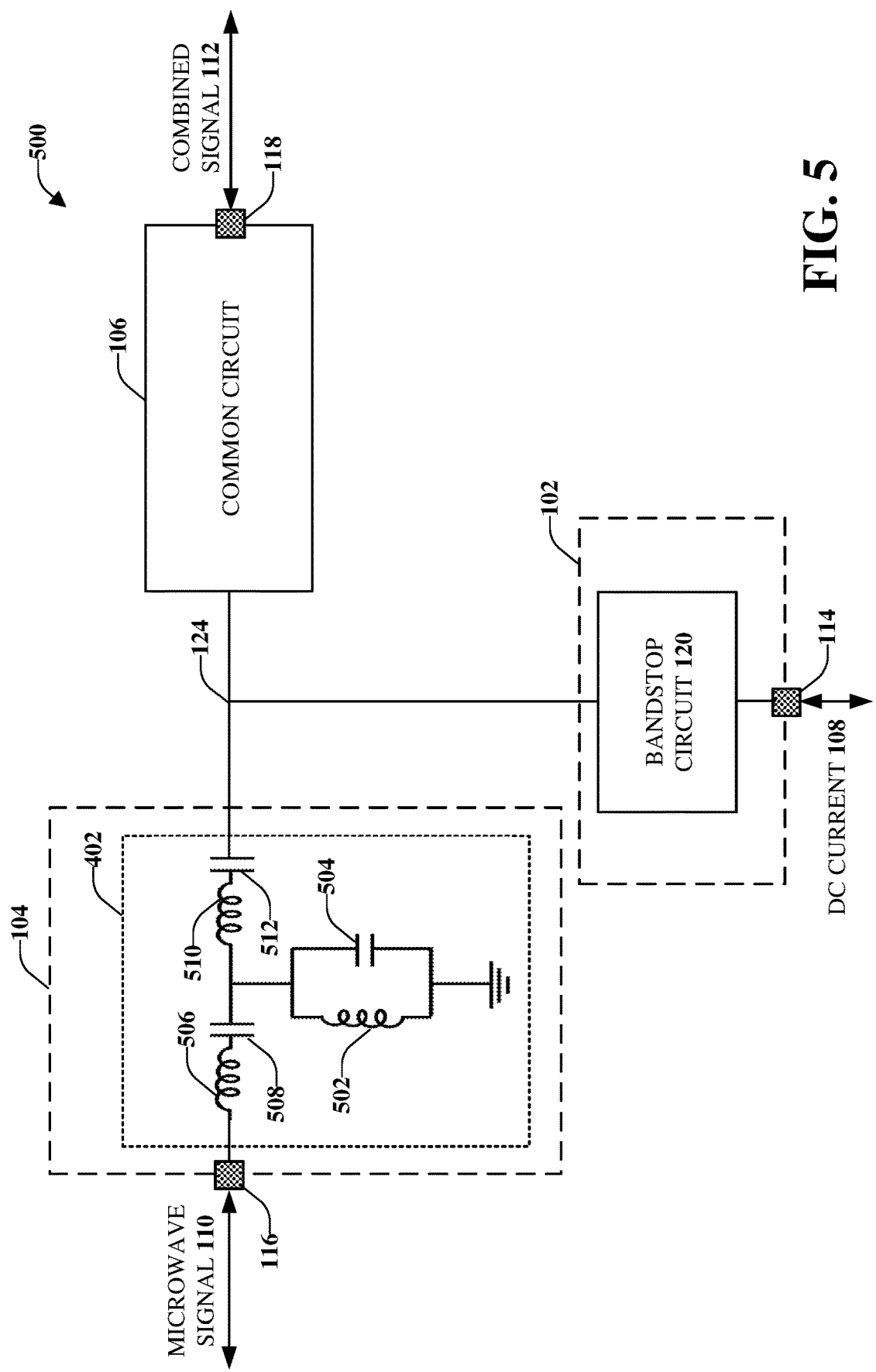
FIG. 5 illustrates a block diagram of an example, non-limiting, system that comprises another embodiment of a circuit for a combiner and/or separator of direct currents and microwave signals in accordance with one or more embodiments described herein.

FIG. 5 illustrates a block diagram of an example, non-limiting, system 500 that comprises another embodiment of a circuit for a combiner and/or separator of DC currents and microwave signals in accordance with one or more embodiments described herein. Repetitive description of like elements employed in other embodiments described herein is omitted for sake of brevity.

The system 500 can be, for example, a superconducting device (e.g., a superconducting circuit). In an embodiment, the system 500 can be associated with a superconducting combiner. In another embodiment, the system 500 can be associated with a superconducting separator. In certain embodiments, the system 500 can be realized on chip.

The system 500 comprises the DC circuit 102, the microwave circuit 104, and the common circuit 106. In an aspect, the DC circuit 102 can comprise the DC port 114, the microwave circuit 104 can comprise the microwave port 116, and/or the common circuit 106 can comprise the common port 118.

In the embodiment shown in FIG. 5, the DC circuit 102 can comprise the bandstop circuit 120 and the microwave circuit 104 can comprise the bandpass circuit 402. The bandpass circuit 402 can comprise a first inductor 502, a first capacitor 504, a second inductor 506, a second capacitor 508, a third inductor 510, and/or a third capacitor 512. The first inductor 502, the first capacitor 504, the second inductor 506, the second capacitor 508, the third inductor 510, and/or the third capacitor 512 can be implemented, for example, as a set of lumped elements.

In certain embodiments, a position/location for the second inductor 506 and the second capacitor 508 can be swapped without affecting performance. Additionally, or alternatively, in certain embodiments, a position/location for the third inductor 510 and the third capacitor 512 can be swapped without affecting performance. Moreover, in certain embodiments, the bandpass circuit 402 can comprise a different number of unit cells than illustrated in FIG. 5.

In an aspect, the second inductor 506 can be electrically coupled to the microwave port 116. Furthermore, the second inductor 506 can be electrically coupled to the second capacitor 508. The second capacitor 508 can also be electrically coupled to the first inductor 502, the first capacitor 504, and the third inductor 510. The first inductor 502 and the first capacitor 504 can be implemented in parallel. Furthermore, the first inductor 502 and the first capacitor 504 can be electrically coupled to electrical ground. The third inductor 510 can also be electrically coupled to the third capacitor 512. The third capacitor 512 can also be electrically coupled to the common circuit 106 and the DC circuit 102 (e.g., the bandstop circuit 120 of the DC circuit 102).

In a non-limiting example, the first inductor 502 can comprise an inductance value equal to around 0.156 nanohenry (nH), the first capacitor 504 can comprise a capacitance value equal to about 3.32 pF, the second inductor 506 can comprise an inductance value equal to approximately 12.1 nH, the second capacitor 508 can comprise a capacitance value equal to around 42.7 femtofarad (fF), the third inductor 510 can comprise an inductance value equal to about 12.1 nH, and the third capacitor 512 can comprise a capacitance value equal to around 42.7 fF. However, the first inductor 502, the first capacitor 504, the second inductor 506, the second capacitor 508, the third inductor 510, and/or the third capacitor 512 can comprise different values.

Additionally, the system 500 can provide various advantages as compared to conventional DC current and microwave signal combiner and/or separator devices. For example, by employing the system 500, the DC current and microwave signal combiner and/or separator can be realized as on-chip superconducting circuit. The microwave bandwidth of the DC current and microwave signal combiner and/or separator can also be improved. A superconducting device that comprises the DC circuit 102, the microwave circuit 104, and/or the common circuit 106 can also be provided for narrowband communication or wideband communication by employing the system 500. Moreover, isolation between the DC and the microwave ports of a superconducting device that comprises the DC circuit 102, the microwave circuit 104, and the common circuit 106 can also be increased by employing the system 500.

Figure 6A:
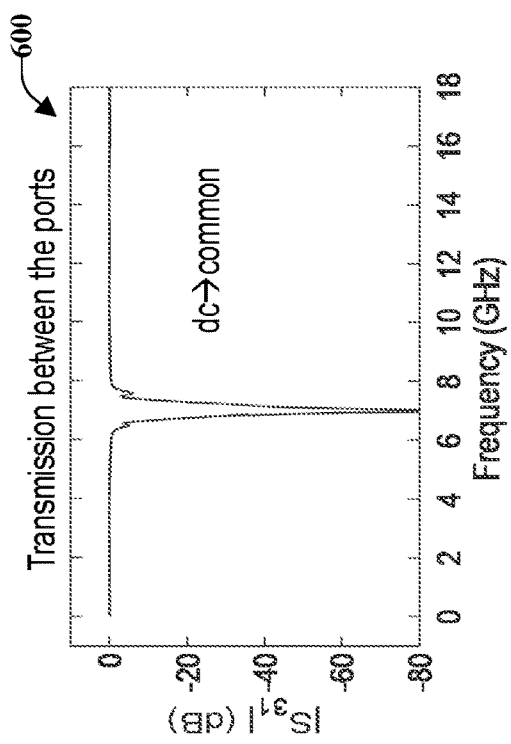
FIGS. 6A-6C illustrate example, non-limiting, graphs of simulation results of the implementation example of the system of FIG. 5 in accordance with one or more embodiments described herein.
Figure 6C:
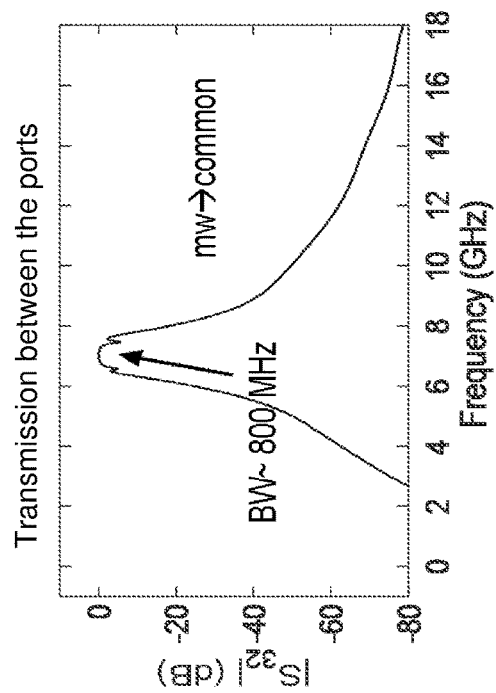
Figure 6B:
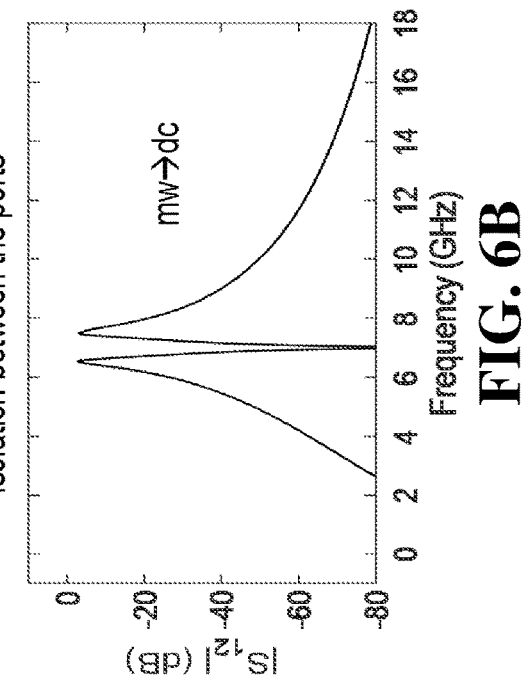

FIGS. 6A-6C illustrate example, non-limiting, graphs of simulation results of the implementation example of the system 500 of FIG. 5 in accordance with one or more embodiments described herein. Repetitive description of like elements employed in other embodiments described herein is omitted for sake of brevity. In the examples of FIGS. 6A-6C, frequency, in Gigahertz (GHz) is illustrated on the horizontal axis and dB s are illustrated on the vertical axis.

FIG. 6A illustrates an example, non-limiting, graph 600 of transmission between the ports (e.g., between the DC port 114 of the DC circuit 102 and the common port 118 of the common circuit 106) according to simulation results. FIG. 6B illustrates an example, non-limiting, graph 602 of isolation between the ports (e.g., between the microwave port 116 of the microwave circuit 104 and the DC port 114 of the DC circuit 102) according to the simulation results. Further, FIG. 6C illustrates an example, non-limiting, graph 604 of the simulation results of transmission between the ports (e.g., between the microwave port 116 of the microwave circuit 104 and the common port 118 of the common circuit 106). FIG. 6C illustrates that a bandwidth of around 800 MHz around 7 GHz can be passed between the microwave port (e.g., the microwave port 116 of the microwave circuit 104) and the common port (e.g., the common port 118 of the common circuit 106).

Figure 7:
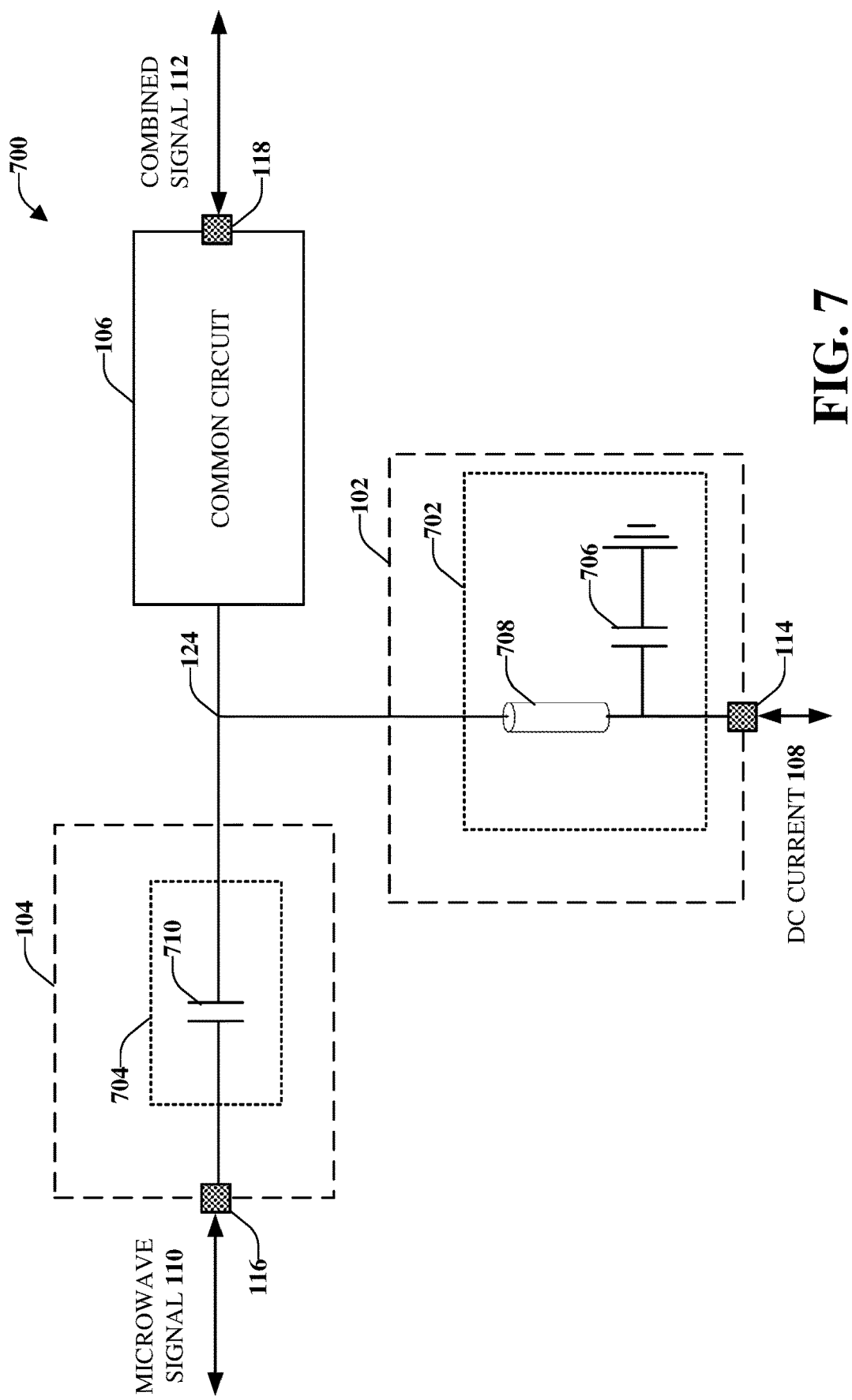
FIG. 7 illustrates a block diagram of an example, non-limiting, system that comprises a further embodiment of a circuit for a combiner and/or separator of direct currents and microwave signals in accordance with one or more embodiments described herein.

FIG. 7 illustrates a block diagram of an example, non-limiting, system 700 that comprises a further embodiment of a circuit for a combiner and/or separator of DC currents and microwave signals in accordance with one or more embodiments described herein. Repetitive description of like elements employed in other embodiments described herein is omitted for sake of brevity.

The system 700 can be, for example, a superconducting device (e.g., a superconducting circuit). In an embodiment, the system 700 can be associated with a superconducting combiner. In another embodiment, the system 700 can be associated with a superconducting separator. In certain embodiments, the system 700 can be realized on chip.

The system 700 comprises the DC circuit 102, the microwave circuit 104, and the common circuit 106. In the embodiment shown in FIG. 7, the DC circuit 102 can comprise a circuit 702 and the microwave circuit 104 can comprise a circuit 704. In an aspect, the circuit 702 can facilitate blocking transmission of one or more microwave signals within a bandwidth of a superconducting device that comprises the DC circuit 102, the microwave circuit 104, and/or the common circuit 106. Furthermore, the circuit 704 can facilitate allowing transmission of one or more microwave signals within a bandwidth of a superconducting device that comprises the DC circuit 102, the microwave circuit 104, and/or the common circuit 106.

The circuit 702 can comprise a capacitor 706 and a transmission line 708. The transmission line 708 can be, for example, a quarter-wavelength transmission line where wavelength refers to a wavelength associated with a center frequency of a superconducting device that comprises the DC circuit 102, the microwave circuit 104, and/or the common circuit 106. The capacitor 706 and the transmission line 708 can be electrically coupled to the DC port 114. The capacitor 706 can also be electrically coupled to electrical ground. The transmission line 708 can also be electrically coupled to the common circuit 106 and the microwave circuit 104 (e.g., a capacitor 710 of the microwave circuit 104).

In one example, the transmission line 708 and the capacitor 706 can block microwave signals within a large bandwidth centered at 7 GHz. In an aspect, the system 700 can be employed in an implementation for microwave signals associated with wideband communication. In a non-limiting example, the capacitor 706 can comprise a capacitance value equal to around 20 pF, the transmission line 708 can comprise an impedance value equal to approximately 50 Ohms, and the capacitor 710 can comprise a capacitance value equal to about 10 pF. However, the capacitor 706, the transmission line 708, and/or the capacitor 710 can have different values.

Additionally, the system 700 can provide various advantages as compared to conventional DC current and microwave signal combiner and/or separator devices. For example, by employing the system 700, the DC current and microwave signal combiner and/or separator can be realized as on-chip superconducting circuit. The microwave bandwidth of the DC current and microwave signal combiner and/or separator can also be improved. A superconducting device that comprises the DC circuit 102, the microwave circuit 104, and/or the common circuit 106 can also be provided for narrowband communication or wideband communication by employing the system 700. Moreover, isolation between the DC and the microwave ports of a superconducting device that comprises the DC circuit 102, the microwave circuit 104, and the common circuit 106 can also be increased by employing the system 700.

FIGS. 8A-8C illustrate example, non-limiting, graphs of simulation results of the implementation example of the system 700 of FIG. 7 in accordance with one or more embodiments described herein. Repetitive description of like elements employed in other embodiments described herein is omitted for sake of brevity. In the examples of FIGS. 8A-8C, frequency, in GHz is illustrated on the horizontal axis and dB s are illustrated on the vertical axis.

FIG. 8A illustrates an example, non-limiting, graph 800 of transmission between the ports (e.g., between the DC port 114 of the DC circuit 102 and the common port 118 of the common circuit 106) according to simulation results. FIG. 8B illustrates an example, non-limiting, graph 802 of isolation between the ports (e.g., between the microwave port 116 of the microwave circuit 104 and the DC port 114 of the DC circuit 102) according to the simulation results. As illustrated, there can be isolation at approximately −35 dB over a wide frequency band. Further, FIG. 8C illustrates an example, non-limiting graph 804 of transmission between the ports (e.g., between the microwave port 116 of the microwave circuit 104 and the common port 118 of the common circuit 106). As illustrated the bandwidth can be approximately 9.7 GHz.

Figure 9:
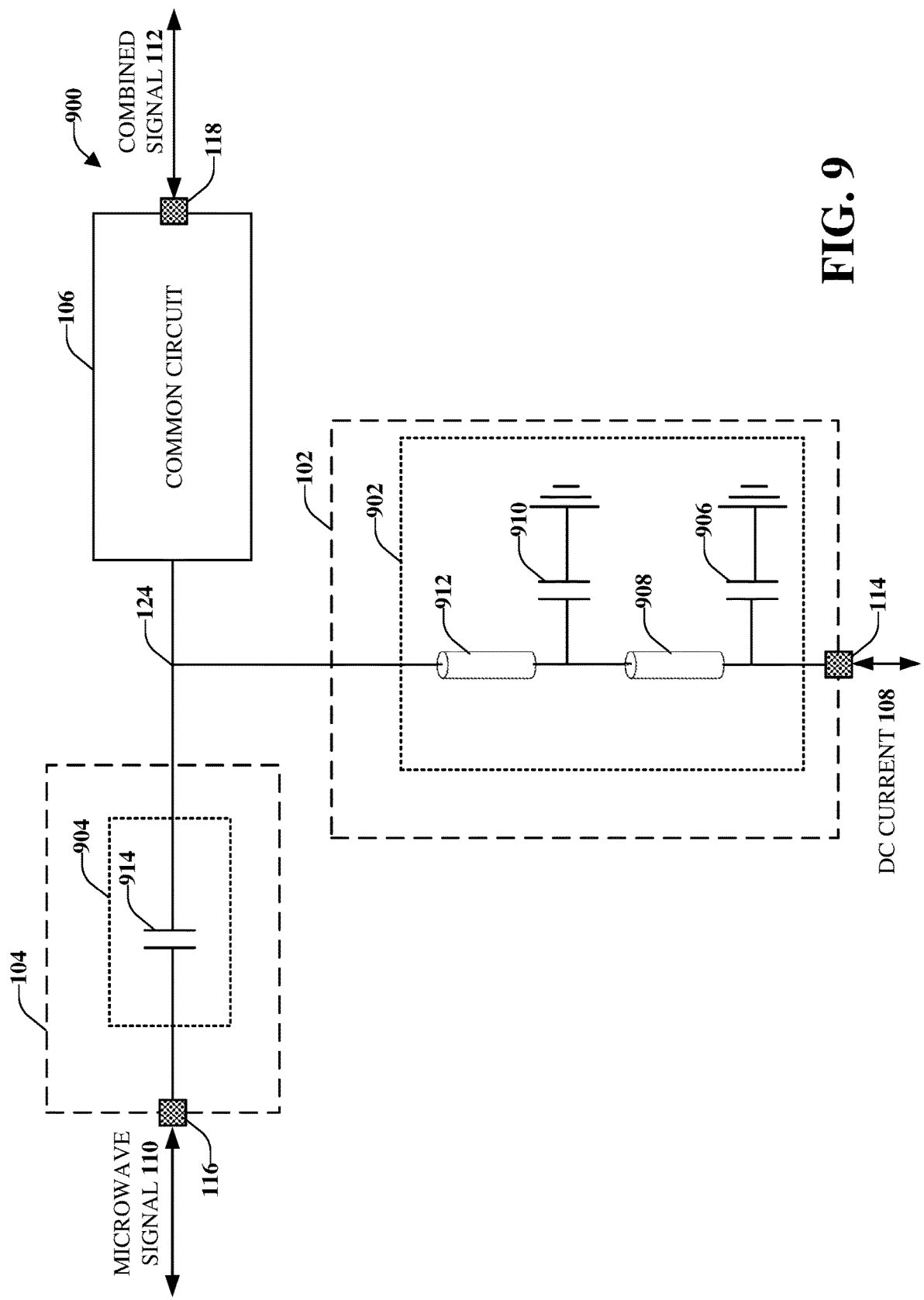
FIG. 9 illustrates a block diagram of an example, non-limiting, system that comprises another embodiment of a circuit for a combiner and/or separator of direct currents and microwave signals in accordance with one or more embodiments described herein.

FIG. 9 illustrates a block diagram of an example, non-limiting, system 900 that comprises another embodiment of a circuit for a combiner and/or separator of DC currents and microwave signals in accordance with one or more embodiments described herein. Repetitive description of like elements employed in other embodiments described herein is omitted for sake of brevity.

The system 900 can be, for example, a superconducting device (e.g., a superconducting circuit). In an embodiment, the system 900 can be associated with a superconducting combiner. In another embodiment, the system 900 can be associated with a superconducting separator. In certain embodiments, the system 900 can be realized on chip. The system 900 comprises the DC circuit 102, the microwave circuit 104, and the common circuit 106.

In the embodiment shown in FIG. 9, the DC circuit 102 can comprise a circuit 902 and the microwave circuit 104 can comprise a circuit 904. In an aspect, the circuit 902 can facilitate blocking transmission of one or more microwave signals within a bandwidth of a superconducting device that comprises the DC circuit 102, the microwave circuit 104, and/or the common circuit 106. Furthermore, the circuit 904 can facilitate allowing transmission of one or more microwave signals within a bandwidth of a superconducting device that comprises the DC circuit 102, the microwave circuit 104, and/or the common circuit 106.

The circuit 902 can comprise a first capacitor 906, a first transmission line 908, a second capacitor 910, and a second transmission line 912. The first transmission line 908 and the second transmission line 912 can be, for example, a quarter-wavelength transmission line, where the term "wavelength" refers to a wavelength associated with a center frequency of a superconducting device that comprises the DC circuit 102, the microwave circuit 104, and/or the common circuit 106. The first capacitor 906 and the first transmission line 908 can be electrically coupled to the DC port 114. The first capacitor 906 can also be electrically coupled to electrical ground. The first transmission line 908 can also be electrically coupled to the second capacitor 910 and the second transmission line 912. The second capacitor 910 can also be electrically coupled to electrical ground. Furthermore, the second transmission line 912 can also be electrically coupled to the common circuit 106 and the microwave circuit 104 (e.g., a capacitor 914 of the microwave circuit 104).

In one example, a length of the first transmission line 908 can be equal a quarter wavelength at 11 GHz and a length of the second transmission line 912 can be equal to a quarter wavelength at 7 GHz. In an aspect, the system 900 can be employed in an implementation for microwave signals associated with high isolation and/or wideband communication.

In a non-limiting example, the first capacitor 906 can comprise a capacitance value equal to around 20 pF, the first transmission line 908 can comprise an impedance value equal to about 50 Ohms, the second capacitor 910 can comprise a capacitance value equal to approximately 20 pF, the second transmission line 912 can comprise an impedance value equal to about 50 Ohms, and the capacitor 914 can comprise a capacitance value equal to around 10 pF. However, the first capacitor 906, the first transmission line 908, the second capacitor 910, the second transmission line 912, and/or the capacitor 914 can comprise different values than the values discussed herein.

Additionally, the system 900 can provide various advantages as compared to conventional DC current and microwave signal combiner and/or separator devices. For example, by employing the system 900, the DC current and microwave signal combiner and/or separator can be realized as on-chip superconducting circuit. The microwave bandwidth of the DC current and microwave signal combiner and/or separator can also be improved. A superconducting device that comprises the DC circuit 102, the microwave circuit 104, and/or the common circuit 106 can also be provided for narrowband communication or wideband communication by employing the system 900. Moreover, isolation between the DC and the microwave ports of a superconducting device that comprises the DC circuit 102, the microwave circuit 104, and the common circuit 106 can also be increased by employing the system 900.

Figure 10A:
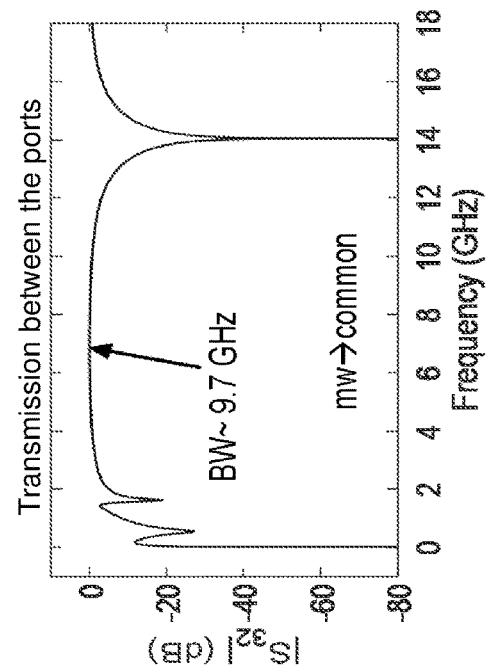
FIGS. 10A-10C illustrate example, non-limiting, graphs of simulation results of the implementation example of the system of FIG. 9 in accordance with one or more embodiments described herein.
Figure 10B:
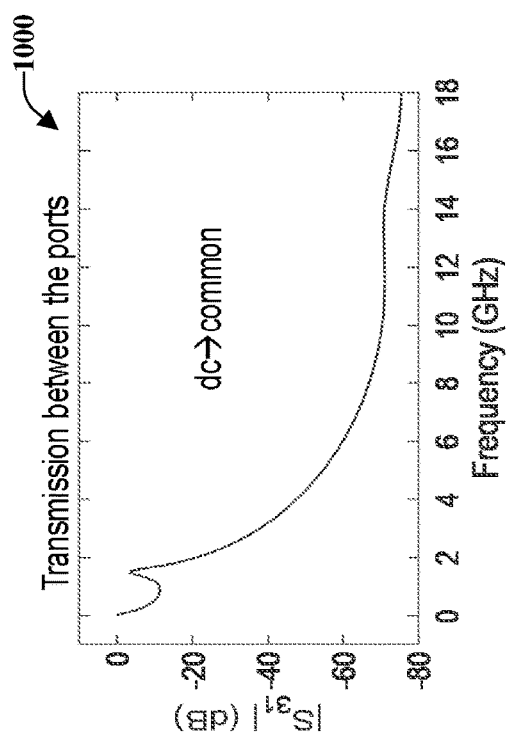
Figure 10C:
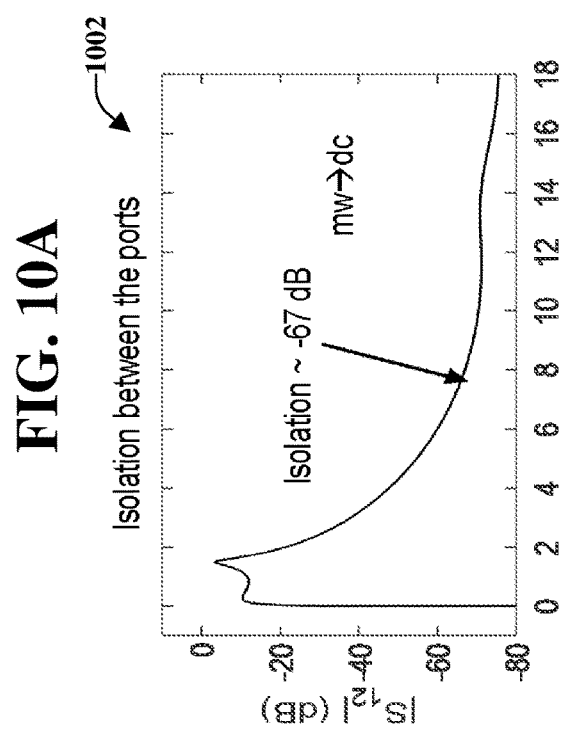

FIGS. 10A-10C illustrate example, non-limiting, graphs of simulation results of the implementation example of the system 900 of FIG. 9 in accordance with one or more embodiments described herein. Repetitive description of like elements employed in other embodiments described herein is omitted for sake of brevity. In the examples of FIGS. 10A-10C, frequency, in GHz, is illustrated on the horizontal axis and dB are illustrated on the vertical (or Y) axis.

FIG. 10A illustrates an example, non-limiting, graph 1000 of transmission between the ports (e.g., between the DC port 114 of the DC circuit 102 and the common port 118 of the common circuit 106) according to simulation results. FIG. 10B illustrates an example, non-limiting, graph 1002 of isolation between the ports (e.g., between the microwave port 116 of the microwave circuit 104 and the DC port 114 of the DC circuit 102) according to the simulation results. As illustrated, there can be isolation at approximately −67 dB over a wide band. Further, FIG. 10C illustrates an example, non-limiting graph 1004 of transmission between the ports (e.g., between the microwave port 116 of the microwave circuit 104 and the common port 118 of the common circuit 106). As illustrated the bandwidth can be approximately 9.7 GHz.

Figure 11:
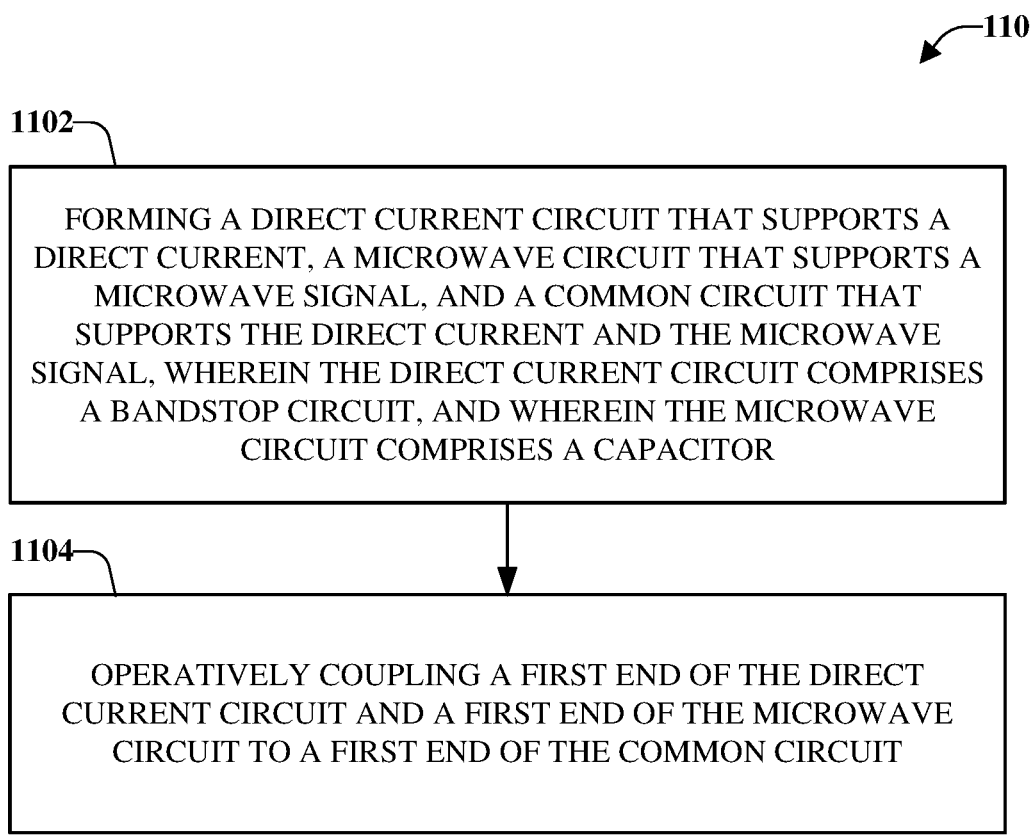
FIG. 11 illustrates a flow diagram of an example, non-limiting, method for fabrication of cryogenic combiners and/or separators of direct currents and microwave signals in accordance with one or more embodiments described herein.

FIG. 11 illustrates a flow diagram of an example, non-limiting, method 1100 for fabrication of cryogenic combiners and/or separators of DC currents and microwave signals in accordance with one or more embodiments described herein. Repetitive description of like elements employed in other embodiments described herein is omitted for sake of brevity.

The method 1100 starts at 1102 with forming a DC circuit (e.g., the DC circuit 102) that supports a DC current (e.g., the DC current 108), a microwave circuit (e.g., the microwave circuit 104) that supports a microwave signal (e.g., the microwave signal 110), and a common circuit (e.g., the common circuit 106) that supports the DC current and the microwave signal (e.g., the combined signal 112). Further, at 1104 of the method, a first end of the DC circuit and a first end of the microwave circuit can be operatively coupled to a first end of the common circuit.

The DC circuit can comprise a bandstop circuit (e.g., the bandstop circuit 120). Further, the microwave circuit can comprise a capacitor (e.g., the capacitor 122). In an example, the bandstop circuit can be formed with a bandstop filter that supports the DC current and blocks microwave signals that are within a bandwidth range of a superconducting device.

Figure 12:
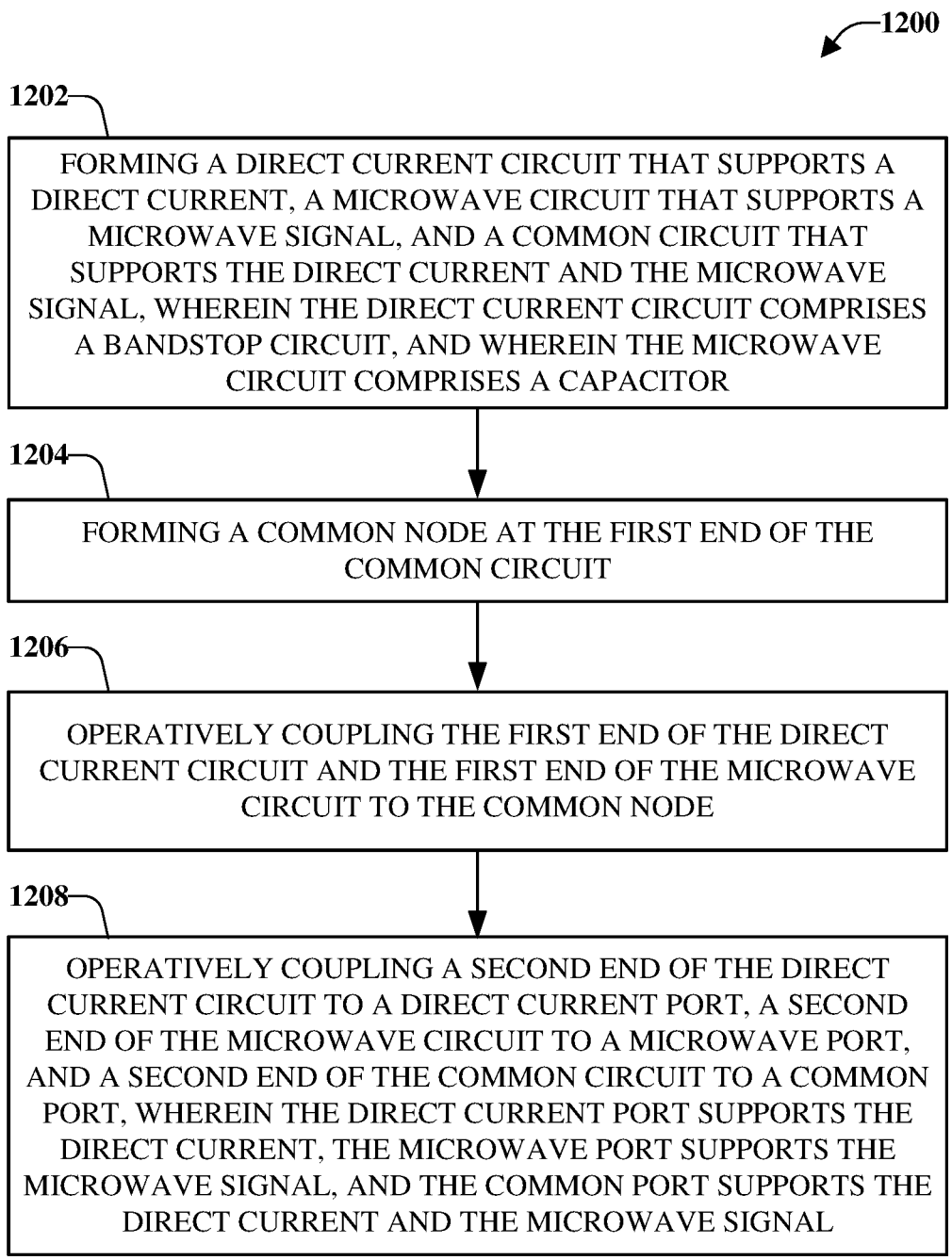
FIG. 12 illustrates a flow diagram of an example, non-limiting, method for coupling a common circuit to a direct current circuit and a microwave circuit in accordance with one or more embodiments described herein.

FIG. 12 illustrates a flow diagram of an example, non-limiting, method 1200 for coupling a common circuit to a DC circuit and a microwave circuit in accordance with one or more embodiments described herein. Repetitive description of like elements employed in other embodiments described herein is omitted for sake of brevity.

The method 1200 starts at 1202 with forming a DC circuit (e.g., the DC circuit 102) that supports a DC current (e.g., the DC current 108), a microwave circuit (e.g., the microwave circuit 104) that supports a microwave signal (e.g., the microwave signal 110), and a common circuit (e.g., the common circuit 106) that supports the DC current and the microwave signal (e.g., the combined signal 112). The DC circuit can comprise a bandstop circuit (e.g., the bandstop circuit 120). Further, the microwave circuit can comprise a capacitor (e.g., the capacitor 122).

At 1204 of the method, a common node (e.g., the common node 124) can be formed at a first end of the common circuit. Further, at 1206 of the method 1200, the first end of the DC circuit and the first end of the microwave circuit can be operatively coupled to the common node.

In an additional implementation, the method 1200 can comprise, at 1208, operatively coupling a second end of the DC circuit to a DC port (e.g., the DC port 114), a second end of the microwave circuit to a microwave port (e.g., the microwave port 116), and a second end of the common circuit to a common port (e.g., the common port 118). The DC port can support the DC current, the microwave port can support the microwave signal, and the common port can support the DC current and the microwave signal.

Figure 13:
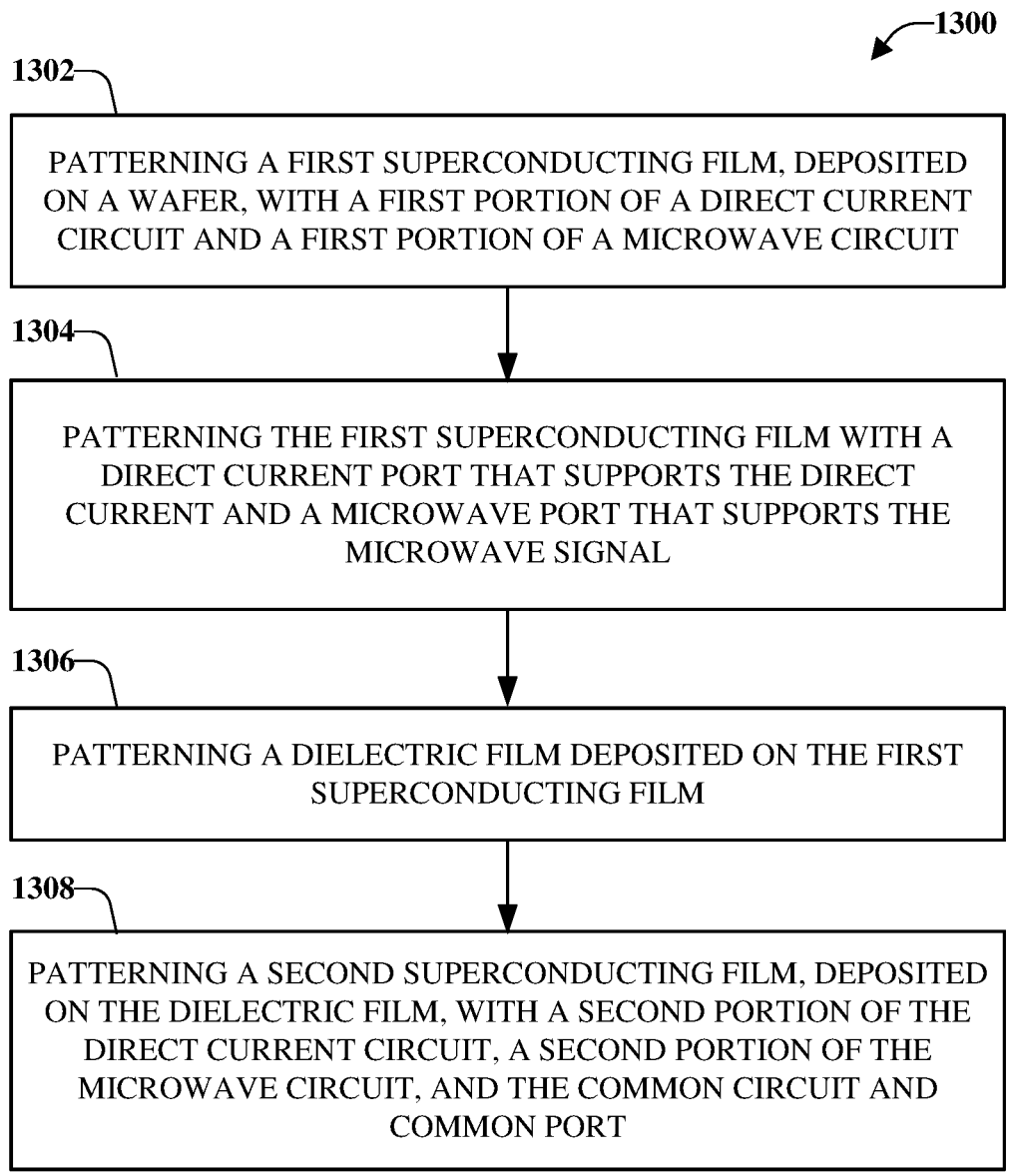
FIG. 13 illustrates a flow diagram of an example, non-limiting, method for forming a direct current circuit, a microwave circuit, and a common circuit in accordance with one or more embodiments described herein.

FIG. 13 illustrates a flow diagram of an example, non-limiting, method 1300 for forming a DC circuit, a microwave circuit, and a common circuit in accordance with one or more embodiments described herein. Repetitive description of like elements employed in other embodiments described herein is omitted for sake of brevity.

The method 1300 starts at 1302 with patterning a first superconducting film, deposited on a wafer, with a first portion of a DC circuit (e.g., the DC circuit 102) and a first portion of a microwave circuit (e.g., the microwave circuit 104). For example, patterning the first superconducting film can comprise, at 1304 of the method 1300, patterning the first superconducting film with a DC port (e.g., the DC port 114) that supports the DC current (e.g., the DC current 108), and a microwave port (e.g., the microwave port 116) that supports the microwave signal (e.g., the microwave signal 110).

At 1306, the method 1300 can comprise patterning a dielectric film deposited on the first superconducting film. Further, at 1308, the method 1300 can comprise patterning a second superconducting film, deposited on the dielectric film, with a second portion of the DC circuit, a second portion of the microwave circuit, and a common circuit (e.g., the common circuit 106 and the common port 118). In an example, patterning the first superconducting film can comprise patterning the first superconducting film with a DC port (e.g., the DC port 114) that supports the DC current and a common port (e.g., the common port 118) that supports the microwave signal and the DC current. Patterning the second superconducting film can comprise patterning a microwave port (e.g., the microwave port 116) that supports the microwave signal.

According to some embodiments, the first superconducting film can be deposited at a first thickness, the dielectric film can be deposited at a second thickness, and the second superconducting film can be deposited at a third thickness. The third thickness can be greater than the first thickness and/or the second thickness.

Figure 14:
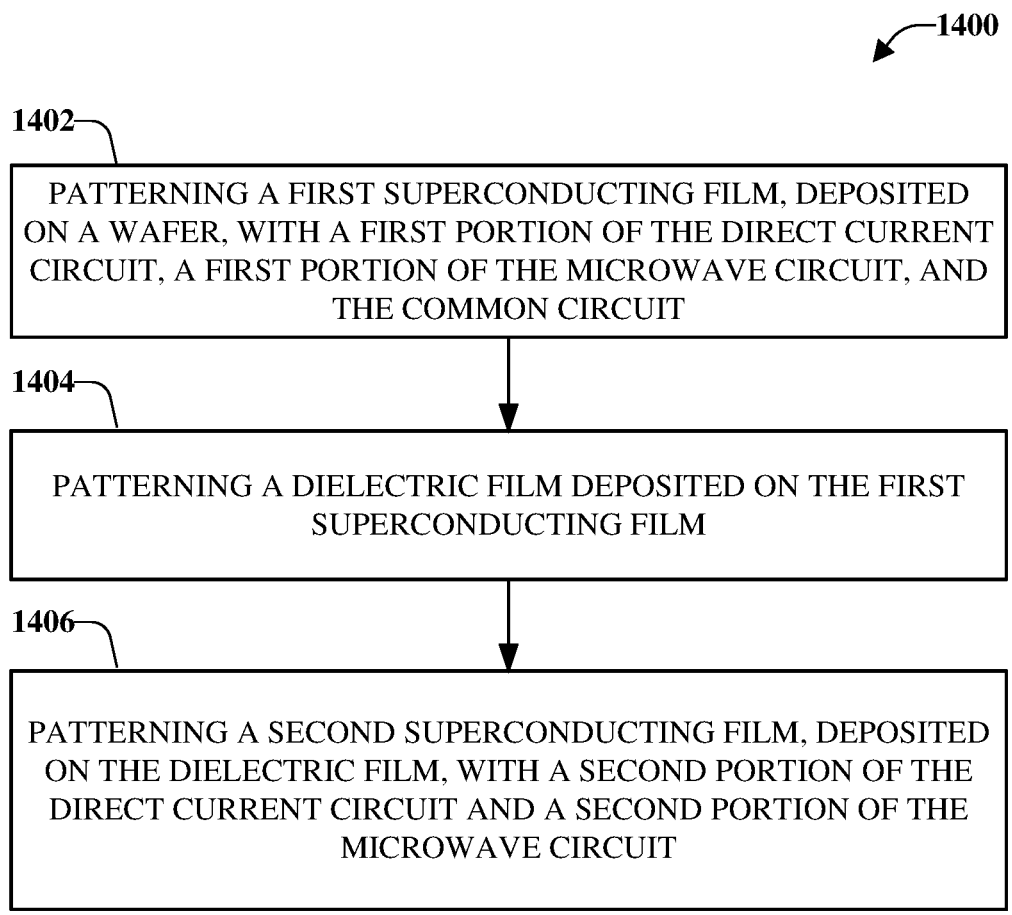
FIG. 14 illustrates a flow diagram of another example, non-limiting, method for forming a direct current circuit, a microwave circuit, and a common circuit in accordance with one or more embodiments described herein.

FIG. 14 illustrates a flow diagram of another example, non-limiting, method 1400 for forming a DC circuit, a microwave circuit, and a common circuit in accordance with one or more embodiments described herein. Repetitive description of like elements employed in other embodiments described herein is omitted for sake of brevity.

The method 1400 starts, at 1402, with patterning a first superconducting film, deposited on a wafer, with a first portion of a DC circuit (e.g., the DC circuit 102), a first portion of a microwave circuit (e.g., the microwave circuit 104), and a common circuit (e.g., the common circuit 106). At 1404 of the method 1400, a dielectric film deposited on the first superconducting film can be patterned. Further, at 1406 the method 1400 can comprise patterning a second superconducting film, deposited on the dielectric film, with a second portion of the DC circuit and a second portion of the microwave circuit.

In an example, patterning the first superconducting film can comprise patterning the first superconducting film with a DC port (e.g., the DC port 114) that supports the DC current, a microwave port (e.g., the microwave port 116) that supports the microwave signal, and a common port (e.g., the common port 118) that supports the microwave signal and the DC current. In another example, patterning the first superconducting film can comprise patterning the first superconducting film with a DC port that supports the DC current and a common port that supports the microwave signal and the DC current. Further to this example, patterning the second superconducting film can comprise patterning a microwave port that supports the microwave signal.

Figure 15:
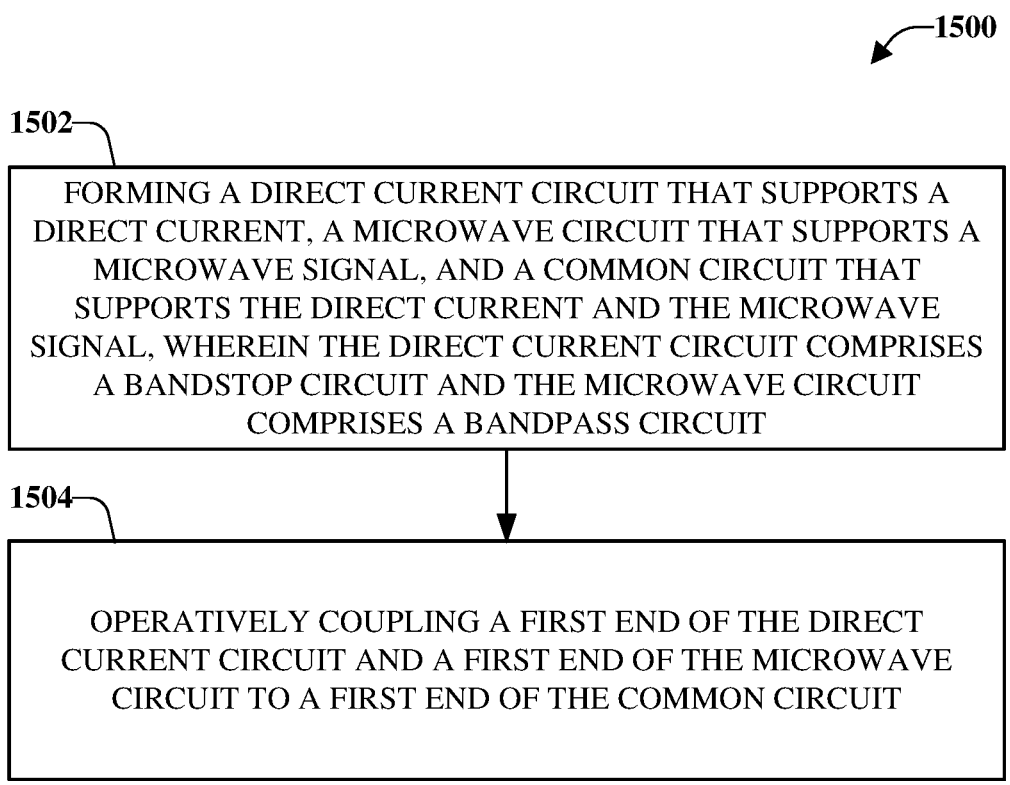
FIG. 15 illustrates a flow diagram of an example, non-limiting, method for fabrication of another embodiment of cryogenic combiners and/or separators of direct currents and microwave signals in accordance with one or more embodiments described herein.

FIG. 15 illustrates a flow diagram of an example, non-limiting, method 1500 for fabrication of another embodiment of cryogenic combiners and/or separators of DC currents and microwave signals in accordance with one or more embodiments described herein. Repetitive description of like elements employed in other embodiments described herein is omitted for sake of brevity.

The method 1500 starts, at 1502, with forming a DC circuit (e.g., the DC circuit 102) that supports a DC current (e.g., the DC current 108), a microwave circuit (e.g., the microwave circuit 104) that supports a microwave signal (e.g., the microwave signal 110), and a common circuit (e.g., the common circuit 106) that supports the DC current and the microwave signal. The DC circuit can comprise a bandstop circuit (e.g., the bandstop circuit 120) and the microwave circuit can comprise a bandpass circuit (e.g., the bandpass circuit 402). Further, at 1504 of the method, a first end of the DC circuit and a first end of the microwave circuit can be operatively coupled to a first end of the common circuit.

Figure 16:
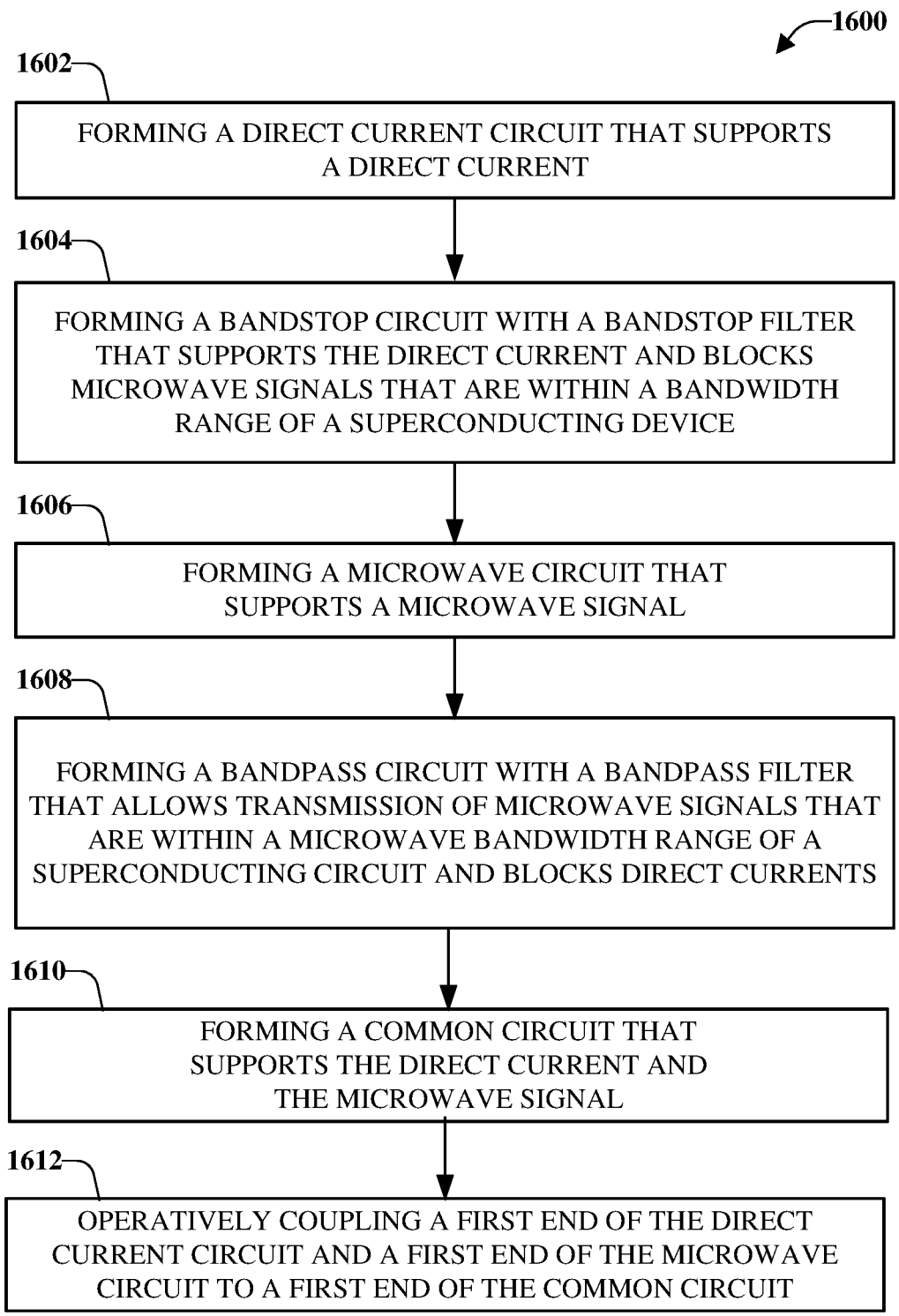
FIG. 16 illustrates a flow diagram of an example, non-limiting, method for fabrication of cryogenic combiners and/or separators of direct currents and microwave signals that comprise a bandstop circuit and a bandpass circuit in accordance with one or more embodiments described herein.

FIG. 16 illustrates a flow diagram of an example, non-limiting, method 1600 for fabrication of cryogenic combiners and/or separators of DC currents and microwave signals that comprise a bandstop circuit and a bandpass circuit in accordance with one or more embodiments described herein. Repetitive description of like elements employed in other embodiments described herein is omitted for sake of brevity.

At 1602 of the method 1600 a DC circuit (e.g., the DC circuit 102) that supports a DC current (e.g., the DC current 108) can be formed. Forming the DC circuit can comprise, at 1604, forming a bandstop circuit (e.g., the bandstop circuit 120) with a bandstop filter that supports the DC current and blocks microwave signals that are within a bandwidth range of a superconducting device.

At 1606 of the method 1600, a microwave circuit (e.g., the microwave circuit 1064) that supports a microwave signal (e.g., the microwave signal 110) can be formed. Forming the microwave circuit can comprise, at 1608 of the method 1600, forming a bandpass circuit (e.g., the bandpass circuit 402) with a bandpass filter that allows transmission of microwave signals that are within a microwave bandwidth range of a superconducting circuit and blocks DC currents.

Further, at 1610 of the method, a common circuit (e.g., the common circuit 106) that supports the DC current and the microwave signal can be formed. A first end of the DC circuit and a first end of the microwave circuit can be operatively coupled to a first end of the common circuit at 1612 of the method 1600.

Figure 17:
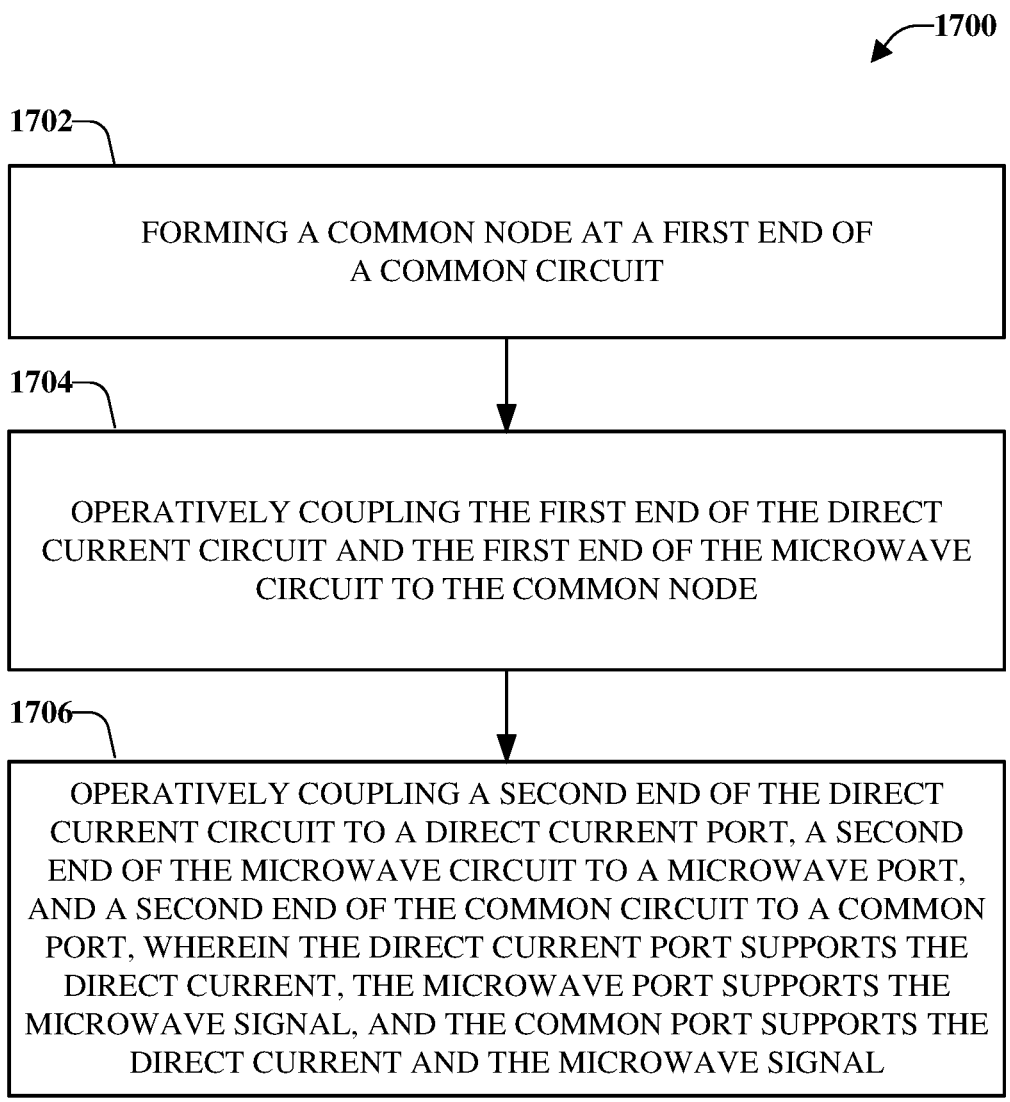
FIG. 17 illustrates a flow diagram of an example, non-limiting, method for coupling a direct current circuit, a microwave circuit, and a common circuit in accordance with one or more embodiments described herein.

FIG. 17 illustrates a flow diagram of an example, non-limiting, method 1700 for coupling a DC circuit, a microwave circuit, and a common circuit in accordance with one or more embodiments described herein. Repetitive description of like elements employed in other embodiments described herein is omitted for sake of brevity.

The method 1700 starts at 1702 when a common node (e.g., the common node 124) can be formed at a first end of a common circuit (e.g., the common circuit 106). The common circuit can support a DC current (e.g., the DC current 108) and a microwave signal (e.g., the microwave signal 110). At 1704 of the method 1700, a first end of a DC circuit (e.g., the DC circuit 102) and a first end of a microwave circuit (e.g., the microwave circuit 104) can be operatively coupled to the common node.

According to some implementations, the method 1700 can comprise, at 1706, operatively coupling a second end of the DC circuit to a DC port (e.g., the DC port 114), a second end of the microwave circuit to a microwave port (e.g., the microwave port 116), and a second end of the common circuit to a common port (e.g., the common port 118). The DC port can support the DC current. The microwave port can support the microwave signal. The common port can support the DC current and the microwave signal.

Figure 18:
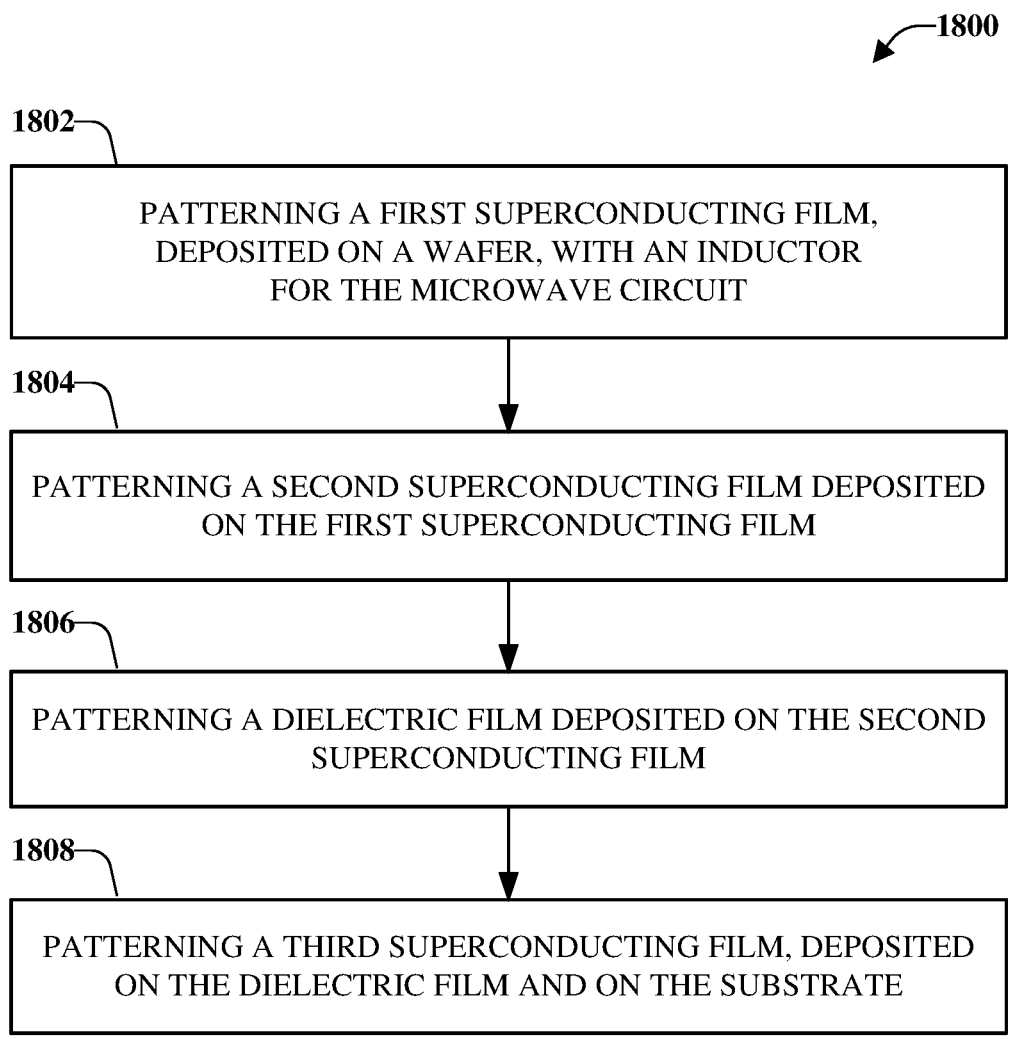
FIG. 18 illustrates a flow diagram of an example, non-limiting, method for fabricating cryogenic combiners and/or separators of direct currents and microwave signals in accordance with one or more embodiments described herein.

FIG. 18 illustrates a flow diagram of an example, non-limiting, method 1800 for fabricating cryogenic combiners and/or separators of DC currents and microwave signals in accordance with one or more embodiments described herein. Repetitive description of like elements employed in other embodiments described herein is omitted for sake of brevity.

The method 1800 starts at 1802, when a first superconducting film, deposited on a wafer, can be patterned with an inductor for a microwave circuit (e.g., the microwave circuit 104). Further, at 1804 of the method 1800, a second superconducting film deposited on the first superconducting film can be patterned. In accordance with an embodiment, patterning the first superconducting film can comprise patterning a DC circuit (e.g., the DC circuit 102), a common circuit (e.g., the common circuit 106), and a first portion of the microwave circuit. Further to this embodiment, patterning the second superconducting film can comprise patterning a second portion of the microwave circuit.

In accordance with another implementation, patterning the first superconducting film can comprise patterning a first portion of the microwave circuit. Further to this implementation, patterning the second superconducting film can comprise patterning the DC circuit, the common circuit, and a second portion of the microwave circuit.

A dielectric film deposited on the second superconducting film can be patterned at 1806 of the method 1800. Further, at 1808, a third superconducting film, deposited on the dielectric film and on the substrate, can be patterned. The third superconducting film can form a contact with the second superconducting film and the first superconducting film.

Figure 19:
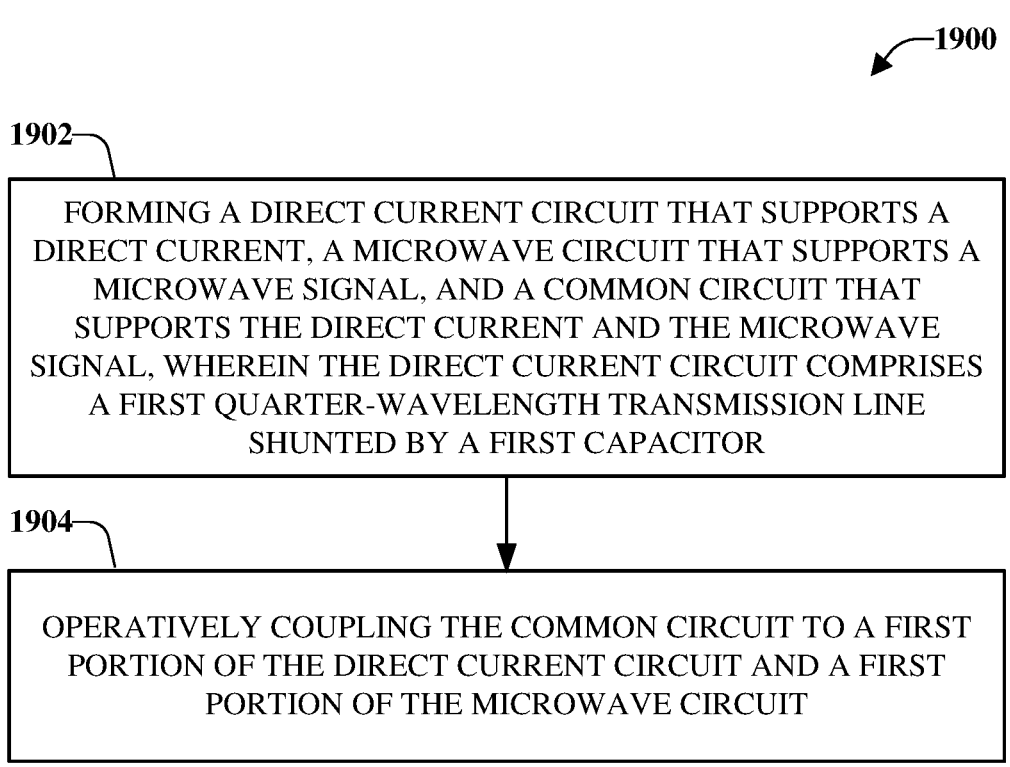
FIG. 19 illustrates a flow diagram of another example, non-limiting, method for fabrication of cryogenic combiners and/or separators of direct currents and microwave signals in accordance with one or more embodiments described herein.

FIG. 19 illustrates a flow diagram of another example, non-limiting, method 1900 for fabrication of cryogenic combiners and/or separators of DC currents and microwave signals in accordance with one or more embodiments described herein. Repetitive description of like elements employed in other embodiments described herein is omitted for sake of brevity.

The method 1900 starts, at 1902, when a DC circuit (e.g., the DC circuit 102) that supports a DC current (e.g., the DC current 108), a microwave circuit (e.g., the microwave circuit 104) that supports a microwave signal (e.g., the microwave signal 110), and a common circuit (e.g., the common circuit 106) that supports the DC current and the microwave signal can be formed. The DC circuit can comprise a first quarter-wavelength transmission line (e.g., the transmission line 708) shunted by a first capacitor (e.g., the capacitor 706). At 1904 of the method, the common circuit can be operatively coupled to a first portion of the DC circuit and a first portion of the microwave circuit (e.g., via the common node 124).

According to an implementation, forming the DC circuit can comprise using the first capacitor to shunt the first quarter-wavelength transmission line to electrical ground. Further to this implementation, forming the microwave circuit can comprise inserting a second capacitor (e.g., the capacitor 710) in the microwave circuit.

According to another implementation, forming the DC circuit can comprise using the first capacitor (e.g., the first capacitor 906) to shunt the first quarter-wavelength transmission line (e.g., the first transmission line 908) to electrical ground and a second capacitor (e.g., the second capacitor 910) to shunt a second quarter-wavelength transmission line (e.g., the second transmission line 912) to electrical ground. Further to this implementation, forming the microwave circuit can comprise inserting a third capacitor (e.g., the capacitor 914) in the microwave circuit.

Figure 20:
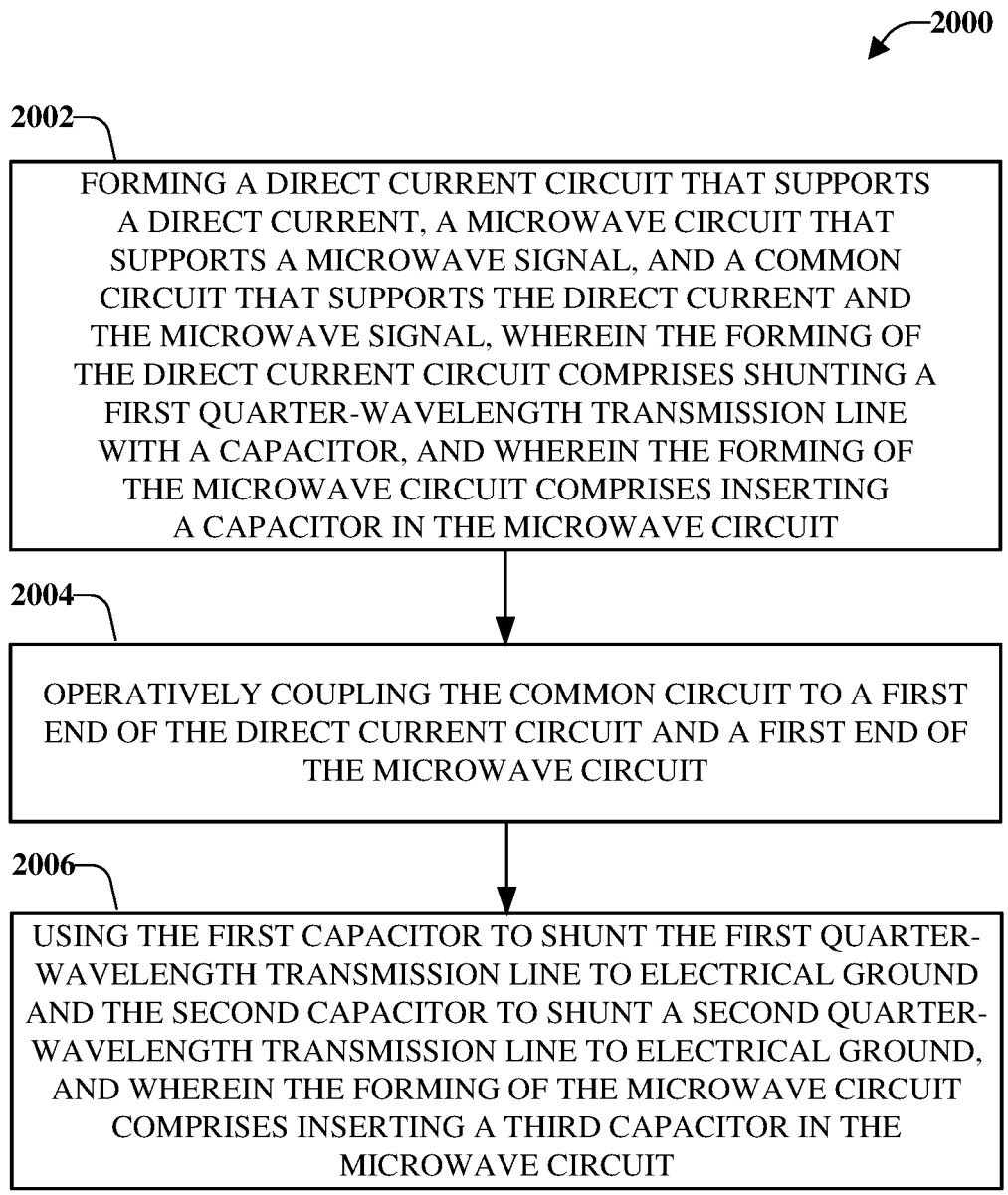
FIG. 20 illustrates a flow diagram of a further example, non-limiting, method for fabrication of cryogenic combiners and/or separators of direct currents and microwave signals in accordance with one or more embodiments described herein.

FIG. 20 illustrates a flow diagram of a further example, non-limiting, method 2000 for fabrication of cryogenic combiners and/or separators of DC currents and microwave signals in accordance with one or more embodiments described herein. Repetitive description of like elements employed in other embodiments described herein is omitted for sake of brevity.

At 2002 of the method, a DC circuit (e.g., the DC circuit 102) that supports a DC current (e.g., the DC current 108), a microwave circuit (e.g., the microwave circuit 104) that supports a microwave signal (e.g., the microwave signal 110), and a common circuit (e.g., the common circuit 106) that supports the DC current and the microwave signal can be formed. For example, forming the DC circuit can comprise shunting a first quarter-wavelength transmission line (e.g., the transmission line 708) with a capacitor (e.g., the capacitor 706). Further, forming the microwave circuit can comprise inserting a capacitor (e.g., the capacitor 710) in the microwave circuit. Further, at 2004 of the method 2000, the common circuit can be operatively coupled to a first end of the DC circuit and a first end of the microwave circuit (e.g., via the common node 124).

According to some implementations, the method 2000 can comprise, at 2006, using a first capacitor (e.g., the first capacitor 906) to shunt a first quarter-wavelength transmission line (e.g., the first transmission line 908) to electrical ground and a second capacitor (e.g., the second capacitor 910) to shunt a second quarter-wavelength transmission line (e.g., the second transmission line 912) to electrical ground. Further to these implementations, forming the microwave circuit can comprise inserting a third capacitor (e.g., the capacitor 914) in the microwave circuit.

Figure 21:
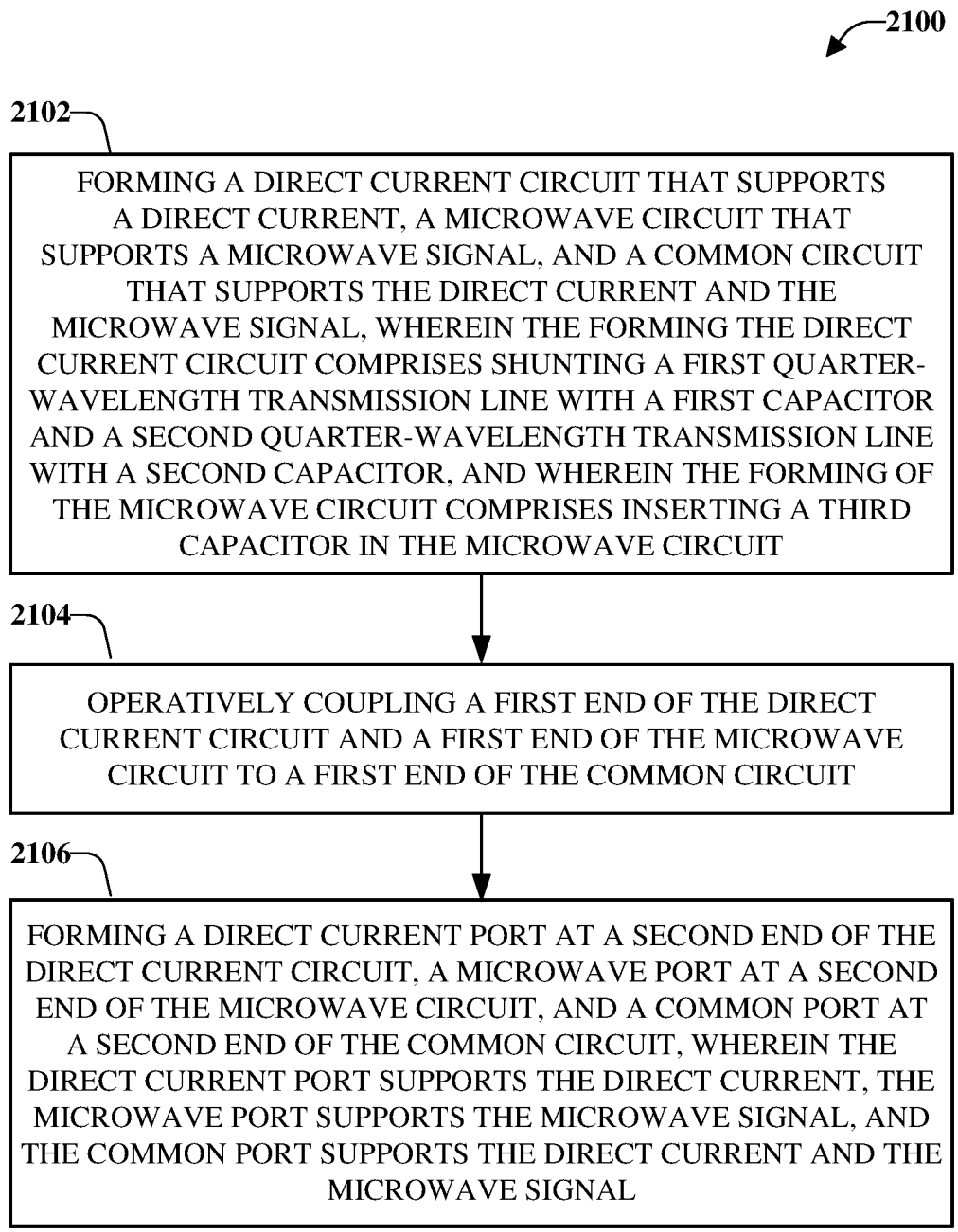
FIG. 21 illustrates a flow diagram of yet another example, non-limiting, method for fabrication of cryogenic combiners and/or separators of direct currents and microwave signals in accordance with one or more embodiments described herein.

FIG. 21 illustrates a flow diagram of yet another example, non-limiting, method 2100 for fabrication of cryogenic combiners and/or separators of DC currents and microwave signals in accordance with one or more embodiments described herein. Repetitive description of like elements employed in other embodiments described herein is omitted for sake of brevity.

At 2102 of the method, a DC circuit (e.g., the DC circuit 102) that supports a DC current (e.g., the DC current 108), a microwave circuit (e.g., the microwave circuit 104) that supports a microwave signal (e.g., the microwave signal 110), and a common circuit (e.g., the common circuit 106) that supports the DC current and the microwave signal can be formed. For example, forming the DC circuit can comprise shunting a first quarter-wavelength transmission line (e.g., the first transmission line 908) with a first capacitor (e.g., the first capacitor 906) and a second quarter-wavelength transmission line (e.g., the second transmission line 912) with a second capacitor (e.g., the second capacitor 910). Further to this example, forming the microwave circuit can comprise inserting a third capacitor (e.g., the capacitor 914) in the microwave circuit. Further, at 2104 of the method 2100, a first end of the DC circuit and a first end of the microwave circuit can be operatively coupled to a first end of the common circuit (e.g., via the common node 124).

According to some implementations, the method 2100 can comprise forming a DC port (e.g., the DC port 114) at a second end of the DC circuit, a microwave port (e.g., the microwave port 116) at a second end of the microwave circuit, and a common port (e.g., the common port 118) at a second end of the common circuit. The DC port can support the DC current, the microwave port can support the microwave signal, and the common port can support the DC current and the microwave signal.

Figure 22:
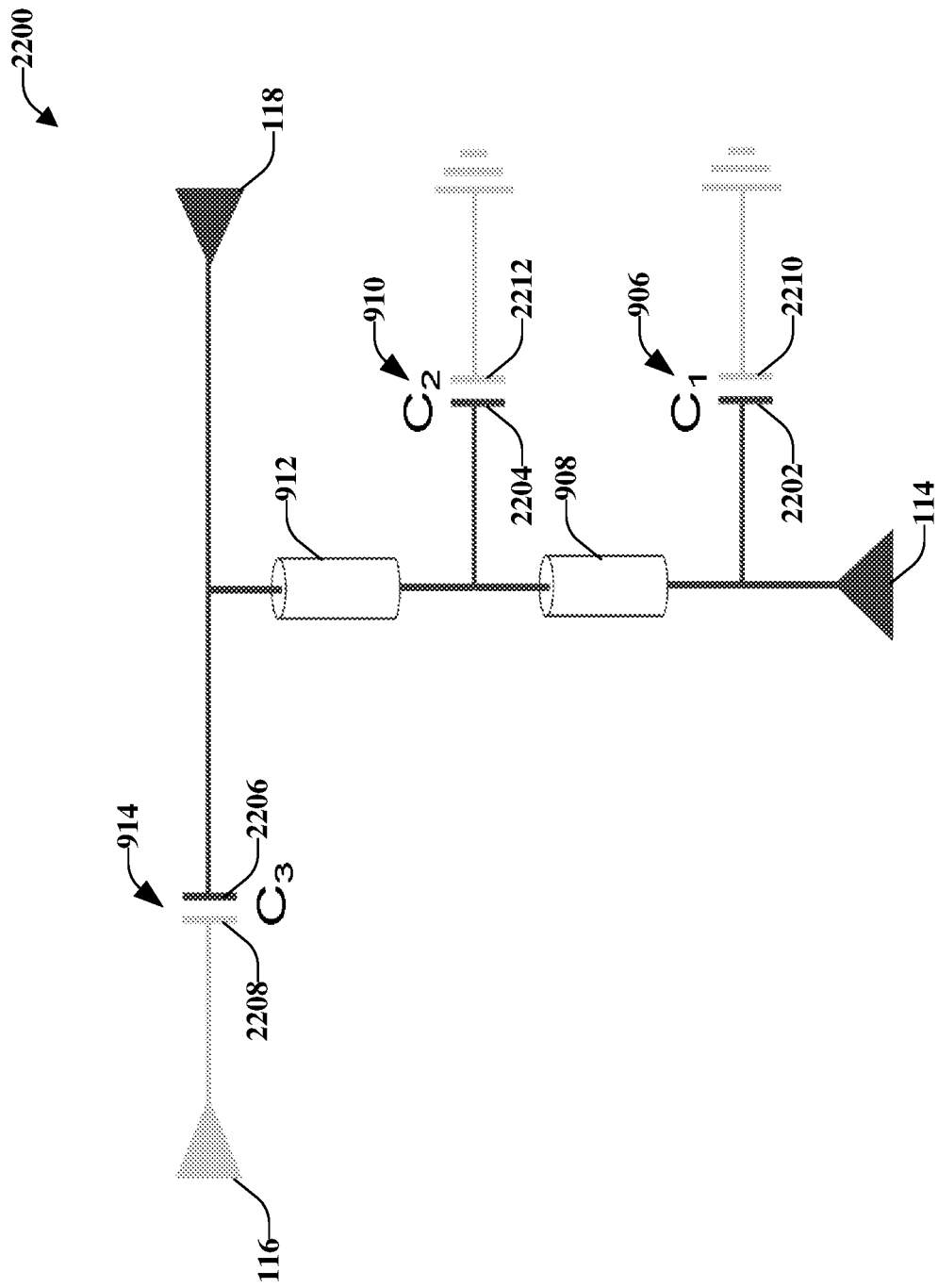
FIG. 22 illustrates an example, non-limiting circuit that can be fabricated in accordance with one or more embodiments described herein.

FIG. 22 illustrates an example, non-limiting, circuit 2200 that can be fabricated in accordance with one or more embodiments described herein. Repetitive description of like elements employed in other embodiments described herein is omitted for sake of brevity.

An example, process flow for the circuit 2200 will be discussed. To form the circuit, the process flow starts with a blanket wafer. A surface of the wafer can be cleaned. Upon or after cleaning, a first superconducting film can be deposited on the wafer surface. According to an implementation, the first superconducting film can be patterned to comprise first portions of the circuit 2200. For example, the first portions can comprise the DC port 114, the common port 118, a first transmission line 908, and a second transmission line 912. Further, the first portions can comprise a first pad 2202 of the first capacitor 906 (C1), a first pad 2204 of the second capacitor 910 (C2), and a first pad 2206 of the capacitor 914 (C3). According to some implementations, the first portions can comprise a ground (GND) plane, if needed. Further, in some implementations, depending on the size of the capacitor 914 (e.g., smaller than a defined size), the entire capacitor (e.g., the first pad 2206 and a second pad 2208) can be patterned (e.g., as a finger capacitor). If both pads (e.g., the first pad 2206 and the second pad 2208) are patterned into the first superconducting film, the microwave port 116 can also be patterned as part of the first portions.

Upon or after patterning the first superconducting film, the surface can be cleaned, as needed. A dielectric film can be deposited for overlap capacitor dielectric. If step edge from patterned first superconducting film is to be covered, the dielectric film should be thicker than the first superconducting film. According to some implementations, the dielectric film can be thicker than the first superconducting film by a range between about 1.01 and 2.25 times. For example, the dielectric film can be thicker than the first superconducting film by 1.5 times or can be double the thickness of the first superconducting film. According to some implementations, the dielectric film can be deposited conformally and can be thinner than, as thick as, or thicker than the first superconducting film. The dielectric film can be patterned (e.g., etched) as needed for the circuit. The dielectric film should remain at least in the overlap capacitor area.

Upon or after patterning the dielectric film, a second superconducting film can be deposited. According to some implementations, the second superconducting film can have etch selectivity to the first superconducting film.

The second superconducting film can be patterned (e.g., etched) to comprise second portions of the circuit 2200. For example, the second portions can comprise the microwave port 116, a second pad 2210 of the first capacitor 906, a second pad 2212 of the second capacitor 910, and the second pad 2208 of the capacitor 914.

According to some implementations, the first portions patterned into the first superconducting film can comprise the microwave port 116, the second pad 2210 of the first capacitor 906, the second pad 2212 of the second capacitor 910, the second pad 2208 of the capacitor 914. Further to these implementations, the first portions can comprise a ground (GND) plane, if needed. Further, in some implementations, depending on the size of the capacitor 914 (e.g., smaller than a defined size), the entire capacitor (e.g., the first pad 2206 and a second pad 2208) can be patterned (e.g., as a finger capacitor) with the first portions. Further to these implementations, the second portions can comprise the DC port 114, the common port 118, the first transmission line 908, and the second transmission line 912. Further, the second portions can comprise the first pad 2202 of the first capacitor 906 (C1), the first pad 2204 of the second capacitor 910 (C2), and the first pad 2206 of the capacitor 914 (C3).

Although fabrication of the circuit 2200 has been discussed with respect to an etch process flow, the fabrication could be performed using a lift-off process flow according to some implementations. Further, in some implementations, a combination of etch and lift-off can be utilized for various process flows.

Figure 23:
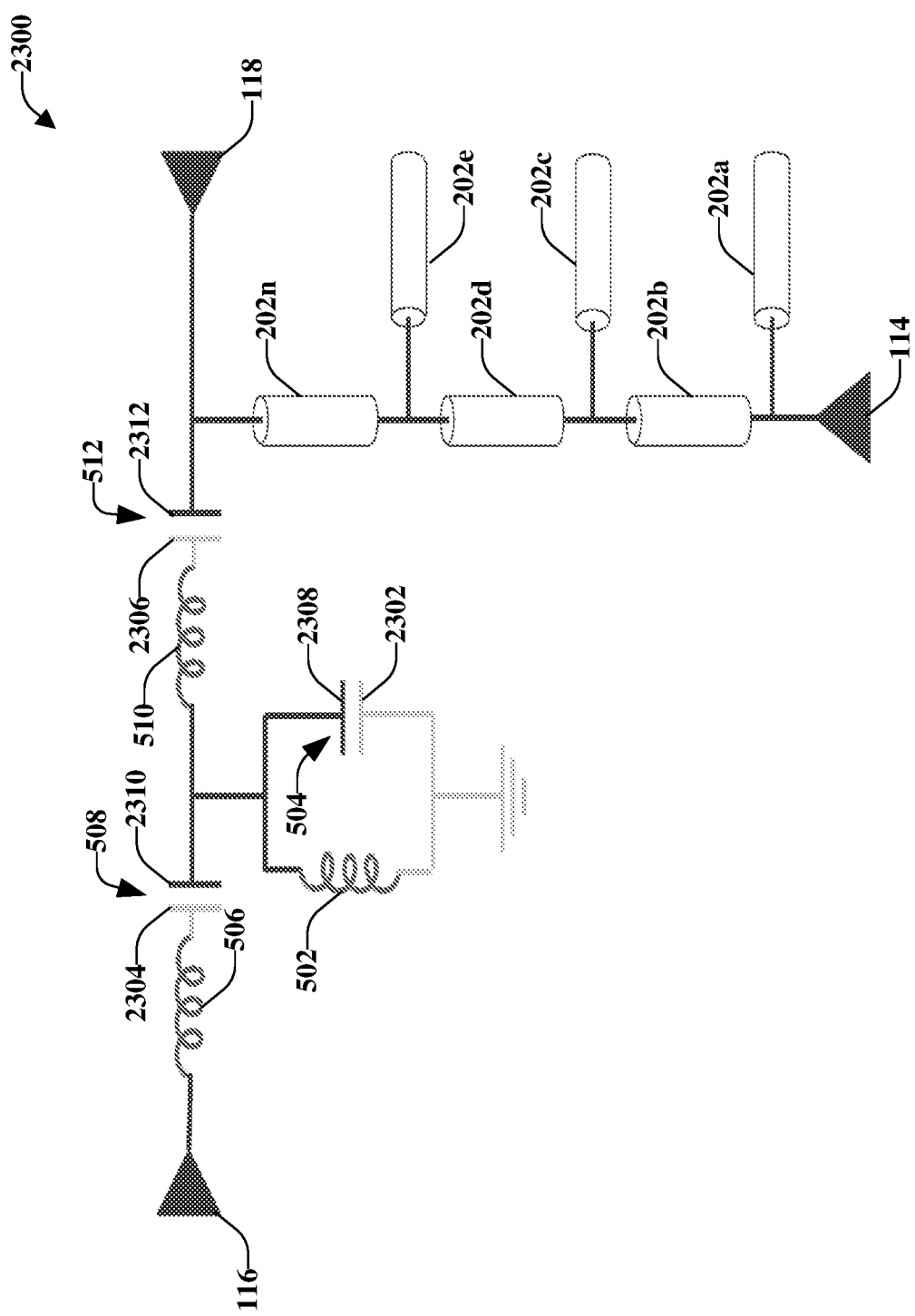
FIG. 23 illustrates another example, non-limiting circuit that can be fabricated in accordance with one or more embodiments described herein.

FIG. 23 illustrates another example, non-limiting, circuit 2300 that can be fabricated in accordance with one or more embodiments described herein. Repetitive description of like elements employed in other embodiments described herein is omitted for sake of brevity.

An example, etch process flow for the circuit 2300 will now be described. To form the circuit 2300, the process flow starts with cleaning a surface of a blanket wafer. Upon or after cleaning, a high kinetic inductance (thin) superconducting film (e.g., a first superconducting film) can be deposited on the wafer. The first superconducting film can be patterned to comprise one or more large inductors. For example, the first superconducting film can be patterned to comprise the first inductor 502, the second inductor 506 and the third inductor 510.

Upon or after patterning the first superconducting film, a second superconducting film can be deposited. The second superconducting film should make good contact with the high kinetic inductance superconducting film (e.g., the first superconducting film). In an example, to make the contact, in-situ surface clean could be performed before deposition. According to some implementations, the second superconducting film can have etch selectivity to the high kinetic inductance superconducting film (e.g., the first superconducting film).

The second superconducting film can be patterned to comprise first portions of the circuit 2300. For example, the first portions can comprise a first pad 2302 of the first capacitor 504 to ground, a first pad 2304 of the second capacitor 508, and a first pad 2306 of the third capacitor 512.

If needed, the surface can be cleaned and a dielectric film (for overlap capacitor dielectric) can be deposited. If step edge from patterned second superconducting film is to be covered, the dielectric film should be thicker than the second superconducting film. According to some implementations, the dielectric film can be thicker than the second superconducting film by a range between about 1.01 and 2.25 times. In an implementation, the dielectric film can be about 1.5 times the thickness of the second superconducting film. According to another implementation, the dielectric film can be about double the thickness of the second superconducting film. According to some implementations, the dielectric film can be deposited conformally and can be thinner than the second superconducting film. The dielectric film can be patterned (e.g., etched), as needed for the circuit 2300. It is noted that the dielectric film should remain at least in overlap capacitor area (e.g., not etched away from this area).

A third superconducting film can be deposited. The third superconducting film should make a good contact with the high kinetic inductance superconducting film (e.g., the first superconducting film). In some implementations, the third superconducting film can have etch selectivity to the first superconducting film and the second superconducting film.

The third superconducting film can be patterned (e.g., etched) to comprise the remaining circuit (e.g., second portions of the circuit 2300). For example, patterning the third superconducting film can comprise patterning a second pad 2308 of the first capacitor 504, a second pad 2310 of the second capacitor 508, a second pad 2312 of the third capacitor 512, the set of transmission lines (e.g., the first transmission line 202a, the second transmission line 202b, the third transmission line 202c, the fourth transmission line 202d, the fifth transmission line 202e, through the nth transmission line 202n), the DC port 114, the microwave port 116, and the common port 118.

According to some implementations, the structures respectively patterned on the second superconducting film and the third superconducting film can be interchanged. For example, the first portions of the circuit can comprise the second pad 2308 of the first capacitor 504, the second pad 2310 of the second capacitor 508, the second pad 2312 of the third capacitor 512, the set of transmission lines (e.g., the first transmission line 202a, the second transmission line 202b, the third transmission line 202c, the fourth transmission line 202d, the fifth transmission line 202e, through the nth transmission line 202n), the DC port 114, the microwave port 116, and the common port 118. Further, the second portions can comprise the first pad 2302 of the first capacitor 504 to ground, the first pad 2304 of the second capacitor 508, and the first pad 2306 of the third capacitor 512. It is noted that the microwave port 116 can be comprised on/patterned in any of the three superconducting films.

Values for high kinetic inductance superconducting inductors can comprise, for example, niobium nitride (NbN) nanowire superinductors that can comprise a thickness of around 20 nanometers (nm), a kinetic inductance (Lk) per square of approximately 82 pH/square. For a 40 nm wide lines, kinetic inductance per unit length of about 2 mH/m can be obtained. To obtain a 12 nH inductor a nanowire of length 6 micrometers (μm) can be utilized.

In another example values for high kinetic inductance superconducting inductors can comprise aluminum-oxide wires (adding oxygen impurities to aluminum thin films) having a thickness of around 20 nm, a Lk per square or around 329 pH/square. Further, niobium titanium nitride (NbTiN) at around 20 nm thickness can yield approximately 20 pH/square.

To make transmission lines with characteristic impedances on the order of around 300 Ohm, a long meander Nb line of width around 1 μm, a thickness of about 100 nm implemented over 350 μm thick substrate can be utilized. For example, to realize an inductance of about 3.8 nH, a superconducting wire of length 2.5 mm can be utilized. The capacitance to ground of such a narrow and long superconducting line is on the order of tens of fF. For 30 fF, the resultant characteristic impedance is about 356 Ohm.

With continuing reference to FIG. 23, a lift-off process flow for the circuit 2300 will be described. To form the circuit 2300, the process flow starts with cleaning a surface of a blanket wafer. A high kinetic inductance (thin) superconducting film (e.g., a first superconducting film) can be deposited. The first superconducting film can be patterned to comprise one or more large inductors, such as through an etch process. For example, the first superconducting film can be patterned to comprise the first inductor 502, the second inductor 506 and the third inductor 510.

Upon or after patterning the first superconducting film, expose and develop resist mask (or hard mask) for a second superconducting film. The second superconducting film can comprise first portions of the circuit 2300. For example, the first portions can comprise a first pad 2302 of the first capacitor 504 to ground, a first pad 2304 of the second capacitor 508, a first pad 2306 of the third capacitor 512. The second superconducting film should make good contact with the high kinetic inductance superconducting film (e.g., the first superconducting film). According to some implementations, an in-situ surface clean could be needed before deposition.

If needed, the surface can be cleaned. Further, a patterned dielectric film can be deposited for overlap capacitor dielectric. If step edge from patterned second superconducting film is to be covered, the dielectric film should be thicker than the second superconducting film. According to some implementations, the dielectric film can be thicker than the second superconducting film by a range between about 1.01 and 2.25 times. In an implementation, the dielectric film can be about 1.5 times the thickness of the second superconducting film. According to another implementation, the dielectric film can be about double the thickness of the second superconducting film. According to yet another implementation, the dielectric film can be deposited conformally and can be thicker, as thick, or thinner than the second superconducting film.

It is noted that the dielectric should remain at least in overlap capacitor area. According to some implementations, small capacitances can be implemented as finger capacitors (e.g., not requiring the deposited dielectric in between overlapping electrodes).

According to some implementations, the patterned dielectric can be achieved by deposition and etch. In some implementations, the patterned dielectric can be achieved by lift-off through a resist mask/hard mask.

The resist mask (or hard mask) can be exposed and developed for the third superconducting film. Thereafter, deposit and lift-off the third superconducting film for the remaining circuit (e.g., second portions of the circuit 2300). It is noted that the third superconducting film should make a good contact with the high kinetic inductance superconducting film (e.g., the first superconducting film).

According to some implementations, the second portions can comprise the second pad 2308 of the first capacitor 504, the second pad 2310 of the second capacitor 508, the second pad 2312 of the third capacitor 512, the set of transmission lines (e.g., the first transmission line 202a, the second transmission line 202b, the third transmission line 202c, the fourth transmission line 202d, the fifth transmission line 202e, through the nth transmission line 202n), the DC port 114, the microwave port 116, and the common port 118.

According to some implementations, the structures respectively patterned on the second superconducting film and the third superconducting film can be interchanged. For example, the first portions of the circuit can comprise the second pad 2308 of the first capacitor 504, the second pad 2310 of the second capacitor 508, the second pad 2312 of the third capacitor 512, the set of transmission lines (e.g., the first transmission line 202a, the second transmission line 202b, the third transmission line 202c, the fourth transmission line 202d, the fifth transmission line 202e, through the nth transmission line 202n), the DC port 114, the microwave port 116, and the common port 118. Further, the second portions can comprise the first pad 2302 of the first capacitor 504 to ground, the first pad 2304 of the second capacitor 508, and the first pad 2306 of the third capacitor 512. It is noted that the microwave port 116 can be comprised on/patterned in any of the three superconducting films.

For simplicity of explanation, the methodologies and/or computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 24:
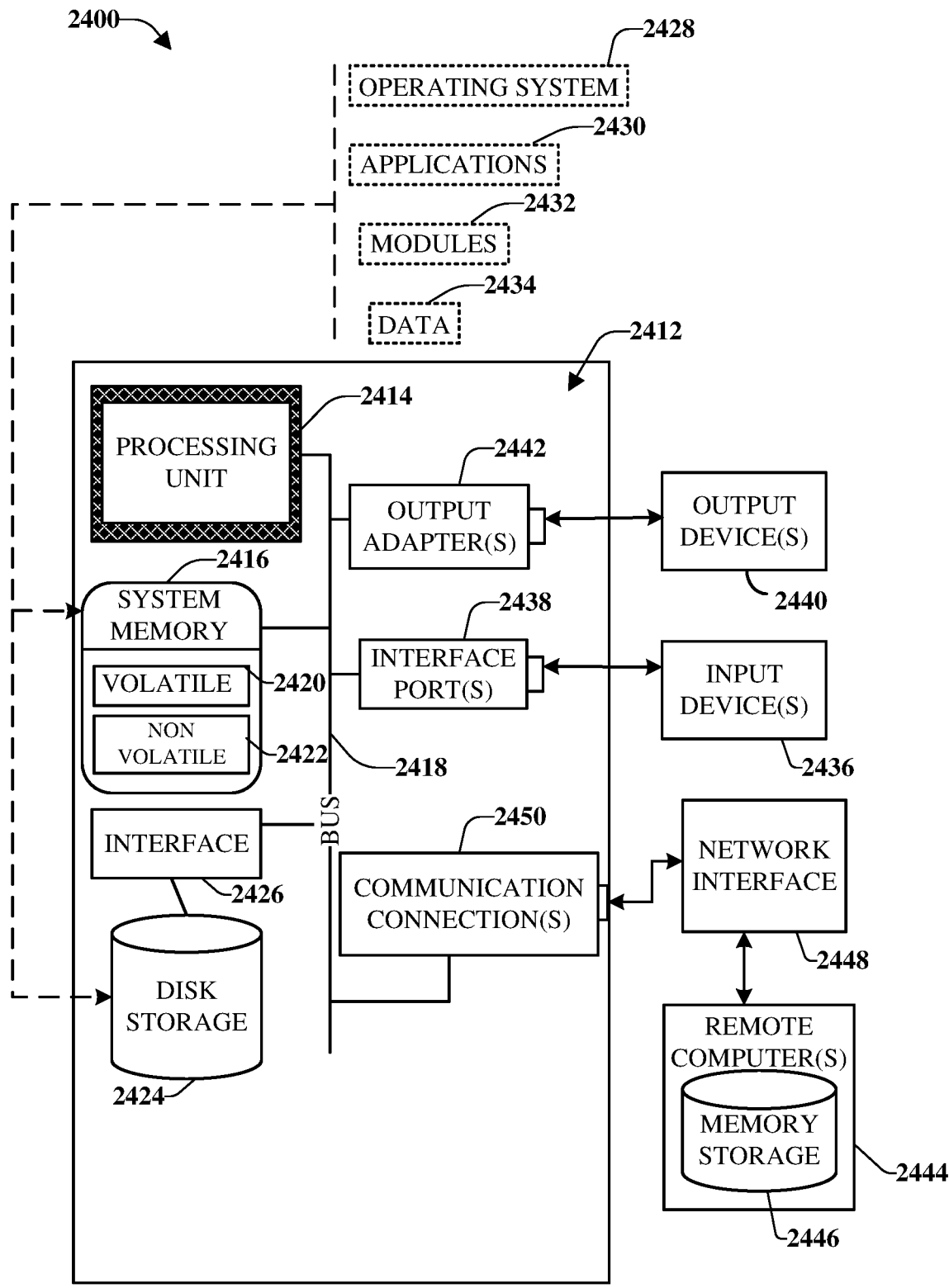
FIG. 24 illustrates a block diagram of an example, non-limiting operating environment in which one or more embodiments described herein can be facilitated.

In order to provide a context for the various aspects of the disclosed subject matter, FIG. 24 as well as the following discussion are intended to provide a general description of a suitable environment in which the various aspects of the disclosed subject matter can be implemented. FIG. 24 illustrates a block diagram of an example, non-limiting operating environment in which one or more embodiments described herein can be facilitated. Repetitive description of like elements employed in other embodiments described herein is omitted for sake of brevity. With reference to FIG. 24, a suitable operating environment 2400 for implementing various aspects of this disclosure can also include a computer 2412. The computer 2412 can also include a processing unit 2414, a system memory 2416, and a system bus 2418. The system bus 2418 couples system components including, but not limited to, the system memory 2416 to the processing unit 2414. The processing unit 2414 can be any of various available processors. Dual microprocessors and other multiprocessor architectures also can be employed as the processing unit 2414. The system bus 2418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 2416 can also include volatile memory 2420 and nonvolatile memory 2422. The basic input/output system (BIOS), containing the basic routines to transfer information between elements within the computer 2412, such as during start-up, is stored in nonvolatile memory 2422. By way of illustration, and not limitation, nonvolatile memory 2422 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 2420 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 2412 can also include removable/non-removable, volatile/non-volatile computer storage media. FIG. 24 illustrates, for example, a disk storage 2424. Disk storage 2424 can also include, but is not limited to, devices like a magnetic disk drive, floppy disk drive, tape drive, Jaz drive, Zip drive, LS-100 drive, flash memory card, or memory stick. The disk storage 2424 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2424 to the system bus 2418, a removable or non-removable interface is typically used, such as interface 2426. FIG. 24 also depicts software that acts as an intermediary between users and the basic computer resources described in the suitable operating environment 2400. Such software can also include, for example, an operating system 2428. Operating system 2428, which can be stored on disk storage 2424, acts to control and allocate resources of the computer 2412. System applications 2430 take advantage of the management of resources by operating system 2428 through program modules 2432 and program data 2434, e.g., stored either in system memory 2416 or on disk storage 2424. It is to be appreciated that this disclosure can be implemented with various operating systems or combinations of operating systems. A user enters commands or information into the computer 2412 through input device(s) 2436. Input devices 2436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2414 through the system bus 2418 via interface port(s) 2438. Interface port(s) 2438 include, for example, a serial port, a parallel port, a game port, and a universal serial bus (USB). Output device(s) 2440 use some of the same type of ports as input device(s) 2436. Thus, for example, a USB port can be used to provide input to computer 2412, and to output information from computer 2412 to an output device 2440. Output adapter 2442 is provided to illustrate that there are some output devices 2440 like monitors, speakers, and printers, among other output devices 2440, which require special adapters. The output adapters 2442 include, by way of illustration and not limitation, video and sound cards that provide a method of connection between the output device 2440 and the system bus 2418. It should be noted that other devices and/or systems of devices provide both input and output capabilities such as remote computer(s) 2444.

Computer 2412 can operate in a networked environment using logical connections to one or more remote computers, such as remote computer(s) 2444. The remote computer(s) 2444 can be a computer, a server, a router, a network PC, a workstation, a microprocessor based appliance, a peer device or other common network node and the like, and typically can also include many or all of the elements described relative to computer 2412. For purposes of brevity, only a memory storage device 2446 is illustrated with remote computer(s) 2444. Remote computer(s) 2444 is logically connected to computer 2412 through a network interface 2448 and then physically connected via communication connection 2450. Network interface 2448 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2450 refers to the hardware/software employed to connect the network interface 2448 to the system bus 2418. While communication connection 2450 is shown for illustrative clarity inside computer 2412, it can also be external to computer 2412. The hardware/software for connection to the network interface 2448 can also include, for exemplary purposes only, internal and external technologies such as, modems including regular telephone grade modems, cable modems and DSL modems, ISDN adapters, and Ethernet cards.

The one or more embodiments can be a system, a circuit, a method, an apparatus, and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing examples. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, example, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
   a direct current circuit that comprises a bandstop circuit that transmits a direct current, wherein the bandstop circuit comprises a bandstop filter that transmits the direct current and blocks microwave signals that are within a bandwidth range of a superconducting device;
   a microwave circuit that comprises a bandpass circuit that transmits a microwave signal, wherein the bandpass circuit comprises a bandpass filter that transmits microwave signals that are within a microwave bandwidth range of a superconducting circuit and blocks the direct current; and
   a common circuit that transmits the direct current and the microwave signal, wherein a first end of the common circuit is coupled to a first end of the direct current circuit and to a first end of the microwave circuit.

2. The circuit of claim 1, wherein the common circuit comprises a common node at the first end of the common circuit, and wherein the common node is coupled to the first end of the direct current circuit and to the first end of the microwave circuit.

3. The circuit of claim 2, wherein a second end of the direct current circuit is coupled to a direct current port that transmits the direct current, a second end of the microwave circuit is coupled to a microwave port that transmits the microwave signal, and a second end of the common circuit is coupled to a common port that transmits the direct current and the microwave signal.

4. The circuit of claim 1, further comprising:
   a first superconducting film deposited on a wafer comprising an inductor;
   a second superconducting film deposited on the first superconducting film;
   a dielectric film deposited on the second superconducting film; and
   a third superconducting film deposited on the dielectric film.

5. The circuit of claim 4, wherein the second superconducting film comprises the direct current circuit, the common circuit, and a first portion of the microwave circuit, and wherein the third superconducting film comprises a second portion of the microwave circuit.

6. The circuit of claim 4, wherein the second superconducting film comprises a first portion of the microwave circuit, and wherein the third superconducting film comprises the direct current circuit, the common circuit, and a second portion of the microwave circuit.

7. A circuit, comprising:
   a direct current circuit that transmits a direct current comprising a first capacitor coupled to electrical ground and that shunts a first quarter-wavelength transmission line;
   a microwave circuit that transmits a microwave signal comprising a second capacitor coupled to electrical ground, wherein the second capacitor shunts a second quarter-wavelength transmission line, and wherein the microwave circuit comprises a third capacitor coupled to electrical ground; and
   a common circuit that transmits the direct current and the microwave signal and is coupled to a first end of the direct current circuit and to a first end of the microwave circuit.

8. The circuit of claim 7, further comprising:
   a first superconducting film deposited on a wafer comprising an inductor;
   a second superconducting film deposited on the first superconducting film;
   a dielectric film deposited on the second superconducting film; and
   a third superconducting film deposited on the dielectric film.

9. The circuit of claim 8, wherein the second superconducting film comprises the direct current circuit, the common circuit, and a first portion of the microwave circuit, and wherein the third superconducting film comprises a second portion of the microwave circuit.

10. The circuit of claim 8, wherein the second superconducting film comprises a first portion of the microwave circuit, and wherein the third superconducting film comprises the direct current circuit, the common circuit, and a second portion of the microwave circuit.

11. A circuit comprising:
    a direct current circuit that transmits a direct current comprising a first capacitor coupled to electrical ground that shunts a first quarter-wavelength transmission line and a second capacitor coupled to electrical ground that shunts a second quarter-wavelength transmission line;

a microwave circuit that transmits a microwave signal comprising a third capacitor coupled to electrical ground; and a common circuit that transmits the direct current and the microwave signal and is coupled to a first end of the direct current circuit and to a first end of the microwave circuit.

12. The circuit of claim 11, wherein the direct current circuit comprises a second end coupled to a direct current port that transmits the direct current, the microwave circuit comprises a second end coupled to a microwave port that transmits the microwave signal, and the common circuit comprises a second end coupled to a common port that transmits the directed current and the microwave signal.

13. The circuit of claim 11, further comprising:
a first superconducting film deposited on a wafer comprising an inductor;
a second superconducting film deposited on the first superconducting film;
a dielectric film deposited on the second superconducting film; and
a third superconducting film deposited on the dielectric film.

14. The circuit of claim 13, wherein the second superconducting film comprises the direct current circuit, the common circuit, and a first portion of the microwave circuit, and wherein the third superconducting film comprises a second portion of the microwave circuit.

15. The circuit of claim 13, wherein the second superconducting film comprises a first portion of the microwave circuit, and wherein the third superconducting film comprises the direct current circuit, the common circuit, and a second portion of the microwave circuit.

16. A circuit comprising:
a first superconducting film deposited on a wafer comprising an inductor;
a second superconducting film deposited on the first superconducting film;
a dielectric film deposited on the second superconducting film;
a third superconducting film deposited on the dielectric film;
a direct current circuit that comprises a bandstop circuit that transmits a direct current;
a microwave circuit that comprises a bandpass circuit that transmits a microwave signal; and
a common circuit that transmits the direct current and the microwave signal, wherein a first end of the common circuit is coupled to a first end of the direct current circuit and to a first end of the microwave circuit;
wherein the second superconducting film comprises the direct current circuit, the common circuit, and a first portion of the microwave circuit, and wherein the third superconducting film comprises a second portion of the microwave circuit.

17. The circuit of claim 16, wherein the bandstop circuit comprises a bandstop filter that transmits the directed current and blocks microwave signals that are within a bandwidth range of a superconducting device, and wherein the bandpass circuit comprises a bandpass filter that transmits microwave signals that are within a microwave bandwidth range of a superconducting circuit and blocks direct current.

18. The circuit of claim 16, wherein the common circuit comprises a common node at the first end of the first of the common circuit, and wherein the common node is coupled to the first end of the direct current circuit and to the first end of the microwave circuit.

19. The circuit of claim 18, wherein a second end of the direct current circuit is coupled to a direct current port that transmits the direct current, a second end of the microwave circuit is coupled to a microwave port that transmits the microwave signal, and a second end of the common circuit is coupled to a common port that transmits the directed current and the microwave signal.

* * * * *